(12) United States Patent
Kathirgamanathan et al.

(10) Patent No.: US 7,811,676 B2
(45) Date of Patent: Oct. 12, 2010

(54) ELECTROLUMINESCENT MATERIALS AND DEVICES

(75) Inventors: Poopathy Kathirgamanathan, North Harrow (GB); Vijendra Kandappu, London (GB); Subramaniam Ganeshamurugan, London (GB); Gnanamoly Paramaswara, London (GB)

(73) Assignee: Merck Patent GmbH, Darmstadt (DE)

( * ) Notice: Subject to any disclaimer, the term of this patent is extended or adjusted under 35 U.S.C. 154(b) by 790 days.

(21) Appl. No.: 10/540,733

(22) PCT Filed: Dec. 23, 2003

(86) PCT No.: PCT/GB03/05663

§ 371 (c)(1),
(2), (4) Date: Jul. 27, 2005

(87) PCT Pub. No.: WO2004/058912

PCT Pub. Date: Jul. 15, 2004

(65) Prior Publication Data

US 2006/0105197 A1 May 18, 2006

(30) Foreign Application Priority Data

Dec. 24, 2002 (GB) ................................. 0230074.7
Dec. 24, 2002 (GB) ................................. 0230077.0

(51) Int. Cl.
*H01L 51/54* (2006.01)

(52) U.S. Cl. ...................... 428/690; 428/917; 313/504; 313/506

(58) Field of Classification Search .................. 428/690, 428/912
See application file for complete search history.

(56) References Cited

U.S. PATENT DOCUMENTS

| 4,443,380 | A | | 4/1984 | Yamazoe et al. | |
|---|---|---|---|---|---|
| 5,281,489 | A | * | 1/1994 | Mori et al. ................. | 428/690 |
| 5,343,050 | A | * | 8/1994 | Egusa et al. .................. | 257/40 |
| 5,723,873 | A | * | 3/1998 | Yang ........................... | 257/40 |
| 6,310,360 | B1 | * | 10/2001 | Forrest et al. ................. | 257/40 |
| 2002/0125818 | A1 | * | 9/2002 | Sato et al. ................... | 313/504 |
| 2003/0012979 | A1 | * | 1/2003 | Verhoeven et al. .......... | 428/690 |
| 2006/0269778 | A1 | * | 11/2006 | Kathirgamanathan et al. ........................ | 428/690 |

FOREIGN PATENT DOCUMENTS

| WO | WO 98/55561 | 12/1998 |
|---|---|---|
| WO | WO 98/58037 | 12/1998 |
| WO | WO 00/26323 | 5/2000 |
| WO | WO 00/44851 | 8/2000 |
| WO | WO 02/33022 | 4/2002 |
| WO | WO 02/43446 | 5/2002 |
| WO | WO 02/087288 | 10/2002 |
| WO | WO 02091814 | * 11/2002 |
| WO | WO 03/093394 | 11/2003 |

OTHER PUBLICATIONS

Hong et al., "Electron-transport properties of rare earth chelates in organic electroluminescent devices," Synthetic Metals, vol. 91, No. 1-3, pp. 271-273, Dec. 1997.*

Adachi et al., "Electroluminescence mechanisms in organic light emitting devices employing a europium chelate doped in a wide energy gap bipolar conducting host," Journal of Applied Physics, vol. 87, No. 11, pp. 8049-8055, Jun. 2000.*

Liang et al., "Exciplex emissions in bilayer and doped thin films containing a non-fluorescent gadolinium complex," Thin Solid Films, vol. 371, No. 1-2, pp. 207-210, Aug. 2000.*

Endo et al., "Organic Electroluminescent Devices Having Metal Complexes as Cathode Interface Layer," Japanese Journal of Applied Physics, vol. 41, No. 7A, pp. L800-L803, Jul. 2002.*

* cited by examiner

*Primary Examiner*—Marie R. Yamnitzky
(74) *Attorney, Agent, or Firm*—David Silverstein; Andover-IP-Law

(57) ABSTRACT

An improved electroluminescent device has a layer of a first electroluminescent metal complex or organo metallic complex and a layer of a second metal complex or organo metallic complex in which the band gap of the metal in the second electroluminescent metal complex or organo metallic complex is larger than the band gap of the metal in the first electroluminescent metal complex or organo metallic complex.

24 Claims, 25 Drawing Sheets

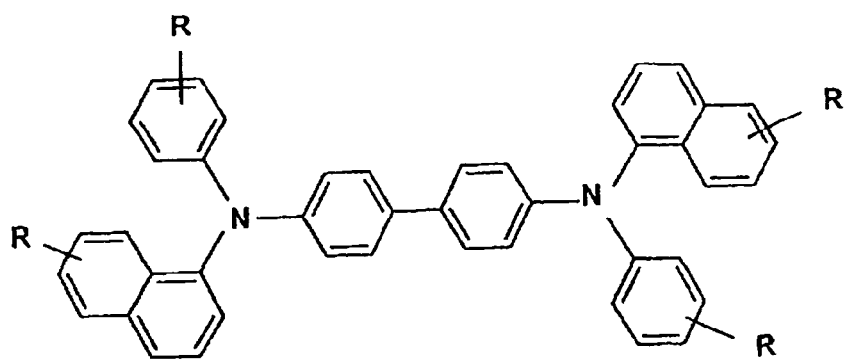
Fig. 4d
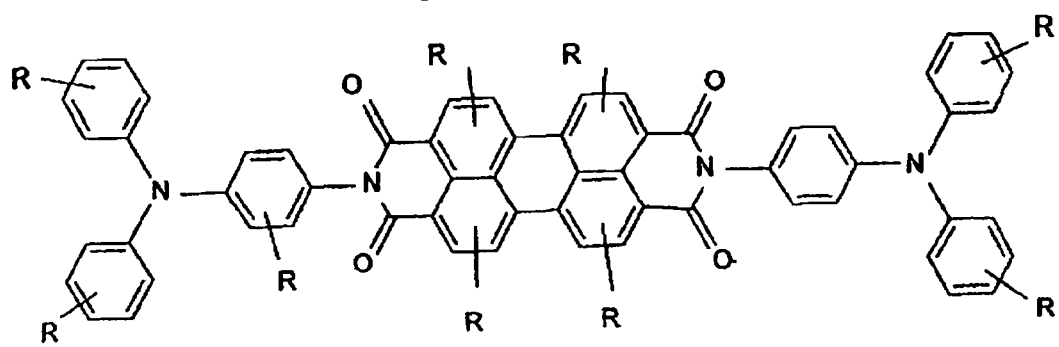
Fig. 4e
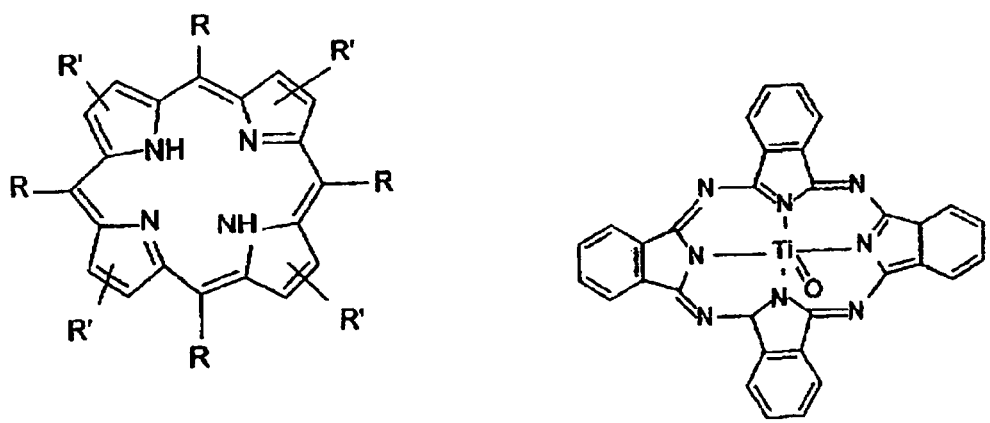
Fig. 4f
Fig. 4g
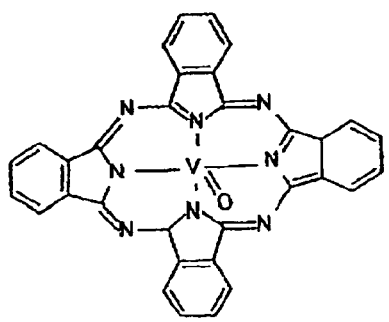
Fig. 4h m= 0,1,2 etc.
n= 0,1,2 etc.

n = 0,1,2 etc.

m= 0,1,2 etc.
m= 0,1,2 etc.

Alq

Bebq

BAlq1

ZnPBO

ZnPBT

DTVb1

EDTA

DCTA

DTPA

TTHA or

α-NPB

TPD mTADATA

Device of example 2

| Voltage / V | Colour Co-ordinates | |
|---|---|---|
| | x | y |
| 22 | 0.61 | 0.33 |
| 24 | 0.62 | 0.33 |
| 26 | 0.62 | 0.34 |
| 28 | 0.63 | 0.35 |
| 30 | 0.63 | 0.35 |
| 33 | 0.63 | 0.35 |
| 36 | 0.63 | 0.35 |
| 39 | 0.63 | 0.35 |
| 42 | 0.63 | 0.35 |
| 46 | 0.62 | 0.36 |
| 50 | 0.62 | 0.36 |
| 54 | 0.61 | 0.37 |
| 58 | 0.61 | 0.37 |
| 62 | 0.60 | 0.38 |
| 66 | 0.59 | 0.39 |

| Voltage / V | Colour Co-ordinates | |
|---|---|---|
| | x | y |
| 30 | 0.62 | 0.32 |
| 33 | 0.62 | 0.32 |
| 36 | 0.62 | 0.33 |
| 39 | 0.66 | 0.33 |
| 42 | 0.66 | 0.33 |
| 46 | 0.66 | 0.33 |
| 50 | 0.66 | 0.33 |
| 54 | 0.66 | 0.33 |
| 58 | 0.66 | 0.33 |
| 62 | 0.66 | 0.33 |
| 67 | 0.66 | 0.33 |
| 72 | 0.65 | 0.33 |
| 77 | 0.65 | 0.33 |
| 82 | 0.65 | 0.33 |

Device of Example 4

| Voltage / V | Colour Co-ordinates | |
|---|---|---|
| | x | y |
| 30 | 0.57 | 0.34 |
| 33 | 0.60 | 0.32 |
| 36 | 0.62 | 0.33 |
| 39 | 0.2 | 0.33 |
| 42 | 0.63 | 0.34 |
| 45 | 0.63 | 0.34 |
| 48 | 0.63 | 0.34 |
| 51 | 0.63 | 0.34 |
| 55 | 0.63 | 0.34 |
| 59 | 0.63 | 0.34 |
| 63 | 0.62 | 0.34 |
| 67 | 0.59 | 0.35 |
| 71 | 0.57 | 0.36 |

ELECTROLUMINESCENT MATERIALS AND DEVICES

CROSS-REFERENCE TO RELATED APPLICATIONS

This application claims benefit of the filing date of international application PCT/GB03/05663 filed Dec. 23, 2003, which claims the benefit of the filing dates of United Kingdom application nos. 0230074.7 filed Dec. 24, 2002 and 0230077.0 filed Dec. 24, 2002.

The present invention relates to electroluminescent materials and to electroluminescent devices.

Materials which emit light when an electric current is passed through them are well known and used in a wide range of display applications. Liquid crystal devices and devices which are based on inorganic semiconductor systems are widely used; however these suffer from the disadvantages of high energy consumption, high cost of manufacture, low quantum efficiency and the inability to make flat panel displays.

Organic polymers have been proposed as useful in electroluminescent devices, but it is not possible to obtain pure colours; they are expensive to make and have a relatively low efficiency.

Another compound which has been proposed is aluminum quinolate, but this requires dopants to be used to obtain a range of colours and has a relatively low efficiency.

Patent application WO98/58037 describes a range of transition metal and lanthanide complexes which can be used in electroluminescent devices which have improved properties and give better results. Patent Applications PCT/GB98/01773, PCT/GB99/03619, PCT/GB99/04030, PCT/GB99/04024, PCT/GB99/04028, PCT/GB00/00268 describe electroluminescent complexes, structures and devices using rare earth chelates.

U.S. Pat. No. 5,128,587 discloses an electroluminescent device which consists of an organometallic complex of rare earth elements of the lanthanide series sandwiched between a transparent electrode of high work function and a second electrode of low work function with a hole conducting layer interposed between the electroluminescent layer and the transparent high work function electrode and an electron conducting layer interposed between the electroluminescent layer and the electron injecting low work function anode. The hole conducting layer and the electron conducting layer are required to improve the working and the efficiency of the device. The hole transporting layer serves to transport holes and to block the electrons, thus preventing electrons from moving into the electrode without recombining with holes. The recombination of carriers therefore mainly takes place in the emitter layer.

It is known that electroluminescent europium organometallic complexes emit light in the red part of the spectrum and application WO98/58037 discloses such complexes.

DETAILED DESCRIPTION OF THE INVENTION

Figure 1:
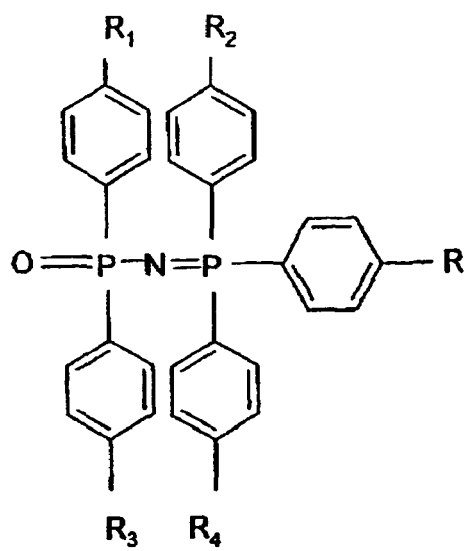
FIGS. 1-16 are formulae drawings for materials which may be used in embodiments of the invention.

We have now devised an electroluminescent structure which gives improved red emission.

According to the invention there is provided an electroluminescent device which comprises (i) a first electrode, (ii) a layer of a first electroluminescent metal complex or organo metallic complex, (iii) a layer of a second metal complex or organo metallic complex and (iv) a second electrode and in which the band gap of the second electroluminescent metal complex or organo metallic complex is larger than the band gap of the first electroluminescent metal complex or organo metallic complex.

There can be more than one layer of each of the first and second electroluminescent metal complex or organo metallic complexes arranged alternatively.

In an electroluminescent organometallic complex when an electron drops from one level to a lower level, light is emitted and the larger the gap between the levels (the band gap) the higher the energy level difference and the shorter the wave length of the light emitted. Normally the metal in the first electroluminescent metal complex or organo metallic complex has a higher HOMO (highest occupied molecular orbital) and a lower LUMO (lowest unoccupied molecular orbital) than the metal in the second electroluminescent metal complex or organo metallic complex.

The band gap of the second organometallic complex can be larger than the band gap of the first electroluminescent metal complex or organo metallic complex by virtue of the metals and/or organic ligands.

The metal in the first and second electroluminescent metal complex or organo metallic complex is preferably selected from Sm(III), Eu(II), Eu(III), Tb(III), Dy(III), Yb(III), Lu(III), Gd(III), U(III), U(VI)O$_2$, Tm(III), Th(IV), Ce(III), Ce(IV), Pr(III), Nd(III), Pm(III), Dy(III), Ho(III), Er(III).

Alternatively the thickness of the layer of the second electroluminescent metal complex or organo metallic complex is too thin to emit light, e.g. of less than 10 nanometres.

The metal in the first electroluminescent metal complex or organo metallic complex can be any metal which forms an electroluminescent metal complex or organo metallic complex, provided the band gap is less than the band gap of the organometallic complex in the second metal complex or organo metallic complex.

Preferred metals in the first electroluminescent metal complex or organo metallic complex are europium which emits light in the red region of the spectrum, terbium which emits light in the green region of the spectrum or dysprosium which emits light in the yellow region of the spectrum.

In the present invention the metal in the second electroluminescent metal complex or organo metallic complex is preferably gadolinium which emits light predominately in the ultra violet region of the spectrum. This has the advantage being that the ultra violet light emitted has no or a limited effect on the colour of the light emitted by the first electroluminescent metal complex or organo metallic complex; another preferred metal is cerium.

The first electroluminescent metal complex or organo metallic complex preferably has the formula (Lα)$_n$M1 where Lα is an organic complex M1 is the metal and n is the valence state of M1.

The second electroluminescent metal complex or organo metallic complex preferably has the formula $(L\alpha)_m M2$ where Lα is an organic complex M2 is the metal and n is the valence state of M2.

Preferred electroluminescent compounds which can be used in the present invention are of formula $(L\alpha)_x Mx \leftarrow Lp$ (A)

where Mx is the metal, x is the valence state of Mx; Lα and Lp are organic ligands and Lp is a neutral ligand. The ligands Lα can be the same or different and there can be a plurality of ligands Lp which can be the same or different For example $(L_1)(L_2)(L_3)Mx\,(Lp)$ where $(L_1)(L_2)(L_3)$ are the same or different organic complexes and (Lp) is a neutral ligand and the different groups $(L_1)(L_2)(L_3)$ may be the same or different.

Lp can be monodentate, bidentate or multidentate and there can be one or more ligands Lp.

The metal in the organometallic complex forming the first and second organometallic layers can be the same provided that the organic ligand is such that the band gap of the organometallic complex forming the second layer is larger than the band gap of the organometallic complex forming the first organometallic layer.

Further electroluminescent compounds which can be used in the present invention are of general formula $(L\alpha)_n MxM3$ where M3 is a non rare earth metal, Lα is as herein and n is the combined valence state of Eu and $M_2$. The complex can also comprise one or more neutral ligands Lp so the complex has the general formula $(L\alpha)_n MxM3(Lp)$, where Lp is as herein. The metal M3 can be any metal which is not a rare earth, transition metal, lanthanide or an actinide. Examples of metals which can be used include lithium, sodium, potassium, rubidium, caesium, beryllium, magnesium, calcium, strontium, barium, copper(I), copper(II), silver, gold, zinc, cadmium, boron, aluminium, gallium, indium, germanium, tin (II), tin(IV), antimony(II), antimony(IV), lead(II), lead(IV) and metals of the first, second and third groups of transition metals in different valence states, e.g. manganese, iron, ruthenium, osmium, cobalt, nickel, palladium(II), palladium(IV), platinum(II), platinum(IV), cadmium, chromium, titanium, vanadium, zirconium, tantalum, molybdenum, rhodium, iridium, titanium, niobium, scandium, yttrium.

Preferred first electroluminescent metal complex or organo metallic complexes are $Eu(DBM)_3 OPNP$ which has a band gap of 3.2 eV and $Eu(TMHD)_3 OPNP$ which has a band gap of 3.7 eV and a preferred gadolinium complex is $Gd(DBM)_3$ Phen, where Phen is phenanthrene, which has a band gap of 3.8 eV.

For typical terbium complexes the band gap is of the order of 3.7 eV.

In order to increase the conductivity of the second organometallic complex layer the layer can be doped with a conductivity improving additive such as a powdered metal, conductive polymer.

Other complexes which can be used to form the second electroluminescent layer are organometallic complexes in which the organic ligand is a boron complex, e.g. of formula

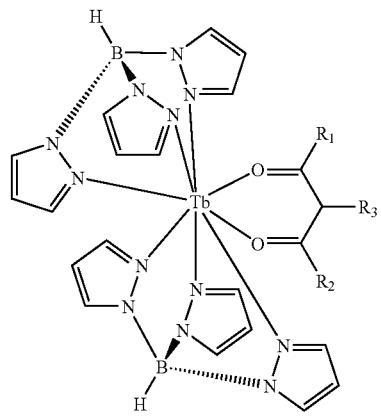

where $R_1$ and $R_2$ are the same or different and are hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine or thiophenyl groups; $R_1$, $R_2$ and $R_3$ are the same or different and are hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine or thiophenyl groups; $R_1$, $R_2$ and $R_3$ can also form substituted and unsubstituted fused aromatic, heterocyclic and polycyclic ring structures, can be copolymerisable with a monomer, e.g. styrene or can be polymer, oligomer or dendrimer substituents.

In place of the terbium other lanthanide, actinide or rare earth metals can be used.

The invention also provides further red emitters and according to this aspect of the invention there is provided an electroluminescent device which comprises (i) a first electrode, (ii) a layer of an electroluminescent europium metal complex or organo metallic complex mixed with an iridium metal complex or organo metallic complex and (iii) a second electrode.

There is preferably also a layer of an electroluminescent europium metal complex or organo metallic complex and the invention also provides electroluminescent devices of structues:—

A. (i) a first electrode (ii) a layer of an electroluminescent europium metal complex or organo metallic complex (iii) a layer of an electroluminescent europium metal complex or organo metallic complex mixed with an iridium metal complex or organo metallic complex and (iv) a second electrode.

B. (i) a first electrode, (ii) a layer of an electroluminescent europium metal complex or organo metallic complex mixed with an iridium metal complex or organo metallic complex, (iii) a layer of an electroluminescent europium metal complex or organo metallic complex and (iv) a second electrode.

C. (i) a first electrode, (ii) a layer of an electroluminescent europium metal complex or organo metallic complex, (iii) a layer of an electroluminescent europium metal complex or organo metallic complex mixed with an iridium metal complex or organo metallic complex, (iv) a layer of an electroluminescent europium metal complex or organo metallic complex and (v) a second electrode.

The electroluminescent europium metal complex or organo metallic complex preferably has the formula (Lα)₃Eu where Lα is an organic complex.

Preferred electroluminescent compounds which can be used in the present invention are of formula (Lα)₃Eu Lp  (AI)

where Lα and Lp are organic ligands and Lp is a neutral ligand. The ligands Lα can be the same or different and there can be a plurality of ligands Lp which can be the same or different.

For example (L₁)(L₂)(L₃)Eu (Lp) where (L₁)(L₂)(L₃) are the same or different organic complexes and (Lp) is a neutral ligand and the different groups (L₁)(L₂)(L₃) may be the same or different, Lp can be monodentate, bidentate or multidentate and there ran be one or more ligands Lp.

Further electroluminescent compounds which can be used in the present invention are of general formula (Lα)ₙEuM₂ where M₂ is a non rare earth metal, Lα is a as herein and n is the combined valence state of Eu and M₂. The complex can also comprise one or more neutral ligands Lp so the complex has the general formula (Lα)ₙ Eu M₂ (Lp), where Lp is as herein. The metal M₂ can be any metal which is not a rare earth. Lanthanide or an actinide examples of metals which can be used include lithium, sodium, potassium, rubidium, caesium, beryllium, magnesium, calcium, strontium, barium, boron, copper(I), copper(II), silver, gold, zinc, cadmium, boron, aluminium, gallium, indium, germanium, tin(II), tin (IV), antimony(II), antimony(IV), lead(II), lead(IV) and metals of the first, second and third groups of transition metals in different valence states, e.g. manganese, iron, ruthenium, osmium, cobalt, nickel, palladium(II), palladium(IV), platinum(II), platinum(IV), cadmium, chromium, titanium, vanadium, zirconium, hafnium, tantulum, molybdenum, rhodium, iridium, titanium, niobium, scandium, yttrium.

A preferred europium complex is Eu(DBM)₃OPNP.

Preferred iridium complexes are iridium acetylacetonate, iridium di-acetylacetonate and Ir(dpp)₃

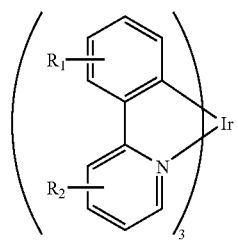

where R₁ and R₂ are as above.

Preferably Lα is selected from β diketones such as those of formulae

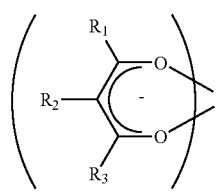

(I)

-continued

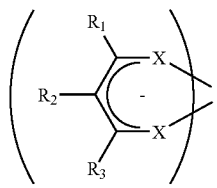

(II)

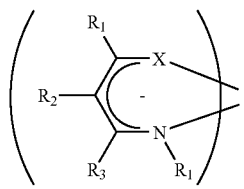

(III)

where R₁, R₂ and R₃ can be the same or different and are selected from hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine or thiophenyl groups; R₁, R₂ and R₃ can also form substituted and unsubstituted fused aromatic, heterocyclic and polycyclic ring structures and can be copolymerisable with a monomer, e.g. styrene. X is Se, S or O, Y can be hydrogen, substituted or unsubstituted hydrocarbyl groups, such as substituted and unsubstituted aromatic, heterocyclic and polycyclic ring structures, fluorine, fluorocarbons such as trifluoryl methyl groups, halogens such as fluorine or thiophenyl groups or nitrile.

Examples of R₁ and/or R₂ and/or R₃ include aliphatic, aromatic and heterocyclic alkoxy, aryloxy and carboxy groups, substituted and substituted phenyl, fluorophenyl, biphenyl, phenanthrene, anthracene, naphthyl and fluorene groups alkyl groups such as t-butyl, heterocyclic groups such as carbazole.

Some of the different groups Lα may also be the same or different charged groups such as carboxylate groups so that the group L₁ can be as defined above and the groups L₂, L₃ . . . can be charged groups such as

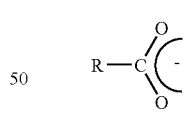

(IV)

where R is R₁ as defined above or the groups L₁, L₂ can be as defined above and L₃ . . . etc. are other charged groups.

R₁, R₂ and R₃ can also be

(V)

where X is O, S, Se or NH.

A preferred moiety R₁ is trifluoromethyl CF₃ and examples of such diketones are, banzoyltrifluoroacetone, p-chlorobenzoyltrifluoroacetone, p-bromotrifluoroacetone, p-phenyltrifluoroacetone, 1-naphthoyltrifluoroacetone, 2-naphthoyltrifluoroacetone, 2-phenanthoyltrifluoroacetone, 3-phenanthoyltrifluoroacetone, 9-anthroyltrifluoroacetonetrifluoroacetone, cinnamoyltrifluoroacetone, and 2-thenoyltrifluoroacetone.

The different groups $L\alpha$ may be the same or different ligands of formulae

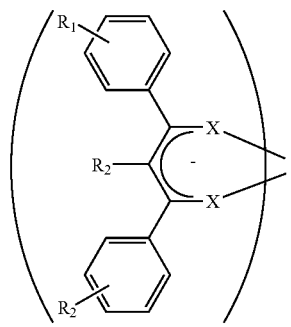
(VI)

where X is O, S, or Se and $R_1$ $R_2$ and $R_3$ are as above.

The different groups $L\alpha$ may be the same or different quinolate derivatives such as

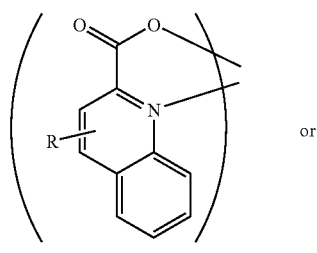
(VII)

or (VIII)

where R is hydrocarbyl, aliphatic, aromatic or heterocyclic carboxy, aryloxy, hydroxy or alkoxy, e.g. the 8 hydroxy quinolate derivatives or

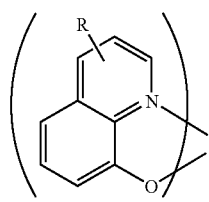
(IX)

or (X)

where R, $R_1$, and $R_2$ are as above or are H or F, e.g. $R_1$ and $R_2$ are alkyl or alkoxy groups

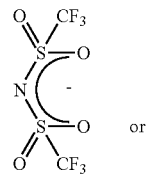
(XI)

or

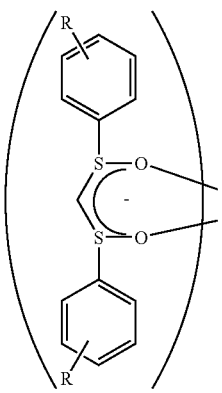
(XII)

As stated above the different groups $L\alpha$ may also be the same or different carboxylate groups e.g.

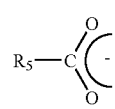
(XIII)

where $R_5$ is a substituted or unsubstituted aromatic, polycyclic or heterocyclic ring a polypyridyl group, $R_5$ can also be a 2-ethyl hexyl group so $L_n$ is 2-ethylhexanoate or $R_5$ can be a chair structure so that $L_n$ is 2-acetyl cyclohexanoate or $L\alpha$ can be

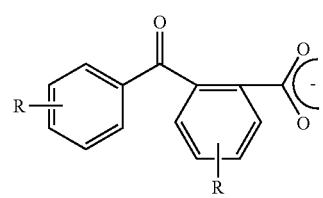
(XIV)

where R is as above, e.g. alkyl, allenyl, amino or a fused ring such as a cyclic or polycyclic ring.

The different groups $L\alpha$ may also be

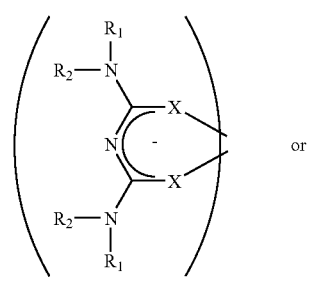
(XV)

or

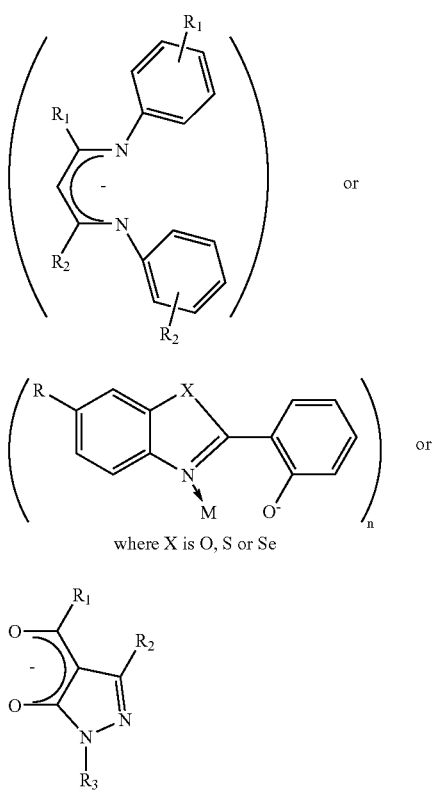

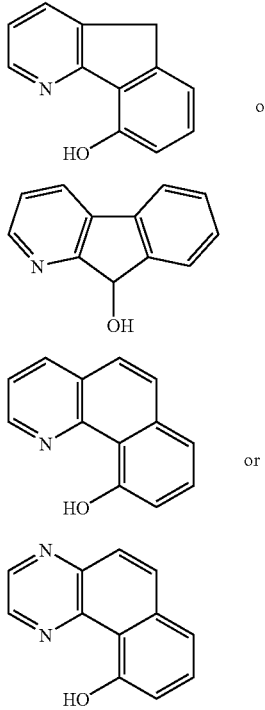

where R, R$_1$ and R$_2$ are as above or

The groups Lp in the formula (A) above can be selected from (XVIII)

Figure 2A:
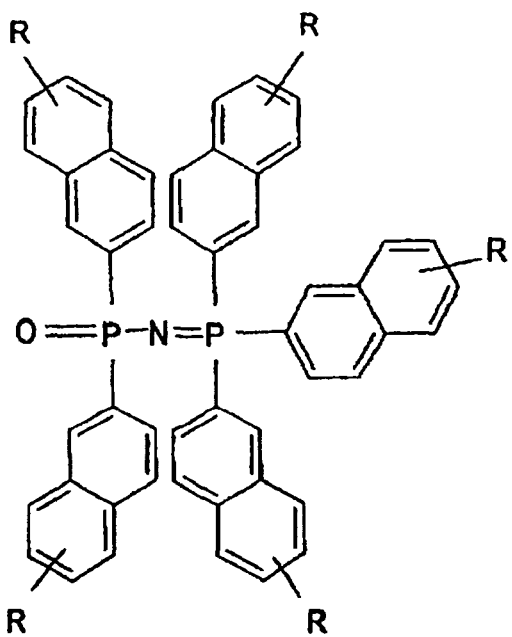
Figure 2B:
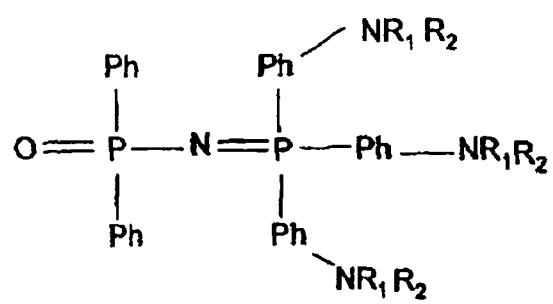

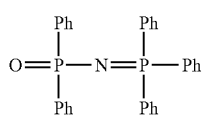

where each Ph which can be the same or different and can be a phenyl (OPNP) or a substituted phenyl group, other substituted or unsubstituted aromatic group, a substituted or unsubstituted heterocyclic or polycyclic group, a substituted or unsubstituted fused aromatic group such as a naphthyl, anthracene, phenanthrene or pyrene group. The substituents can be, for example, an alkyl, aralkyl, alkoxy, aromatic, heterocyclic, polycyclic group, halogen such as fluorine, cyano, amino, substituted amino etc. Examples are given in FIGS. 1 and 2 of the drawings where R, R$_1$, R$_2$, R$_3$ and R$_4$ can be the same or different and are selected from hydrogen, hydrocarbyl groups, substituted and unsubstituted aromatic, heterocyclic and polycyclic ring structures, fluorocarbons such as trifluoryl methyl groups, halogens such as fluorine or thiophenyl groups; R, R$_1$, R$_2$, R$_3$ and R$_4$ can also form substituted and unsubstituted fused aromatic, heterocyclic and polycyclic ring structures and can be copolymerisable with a monomer, e.g. styrene. R, R$_1$, R$_2$, R$_3$ and R$_4$ can also be unsaturated alkylene groups such as vinyl groups or groups

—C—CH$_2$=CH$_2$—R where R is as above.

L$_p$ can also be compounds of formulae (XVIV)

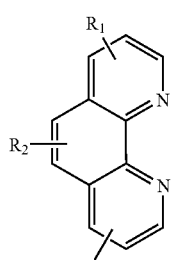

or (XX)

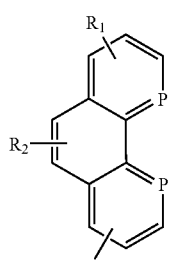

or (XXI)

Figure 3:
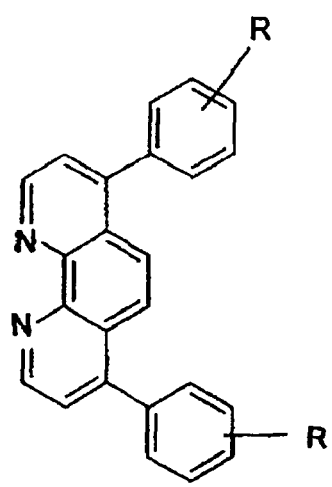

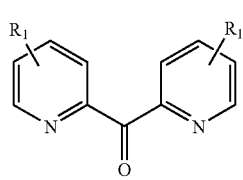

where $R_1$, $R_2$ and $R_3$ are as referred to above, for example bathophen shown in FIG. 3 of the drawings in which R is as above or

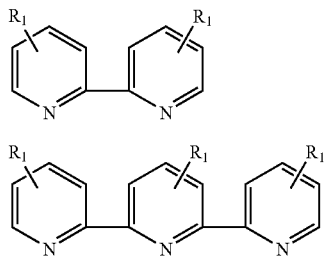

(XXII)

(XXIII)

where $R_1$, $R_2$ and $R_3$ are as referred to above.

$L_p$ can also be

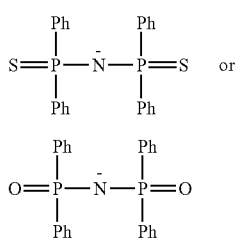

(XXIV)

(XXV)

where Ph is as above.

Other examples of $L_p$ chelates are as shown in FIG. 4 and fluorene and fluorene derivatives, e.g. as shown in FIG. 5 and compounds of formulae as shown in FIGS. 6 to 8.

Figure 11:
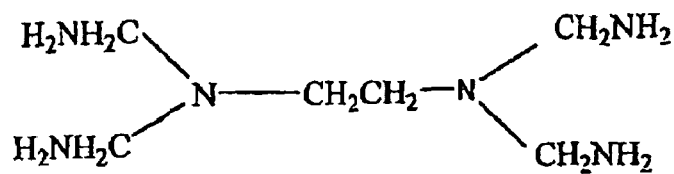
Figure 11:
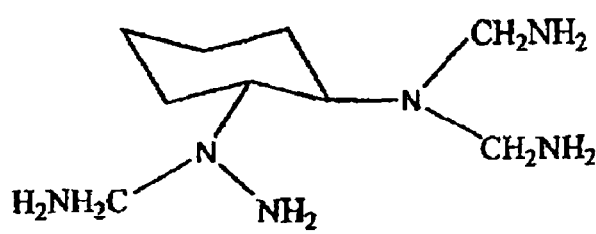
Figure 11:
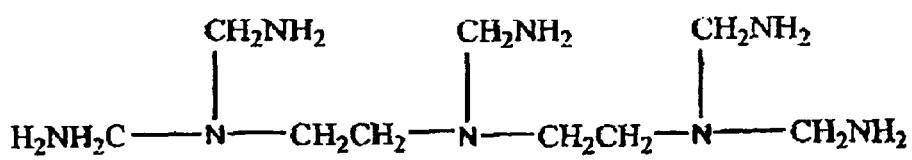
Figure 11:
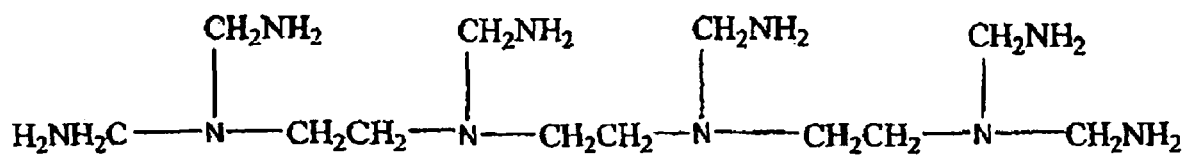
Figure 12A:
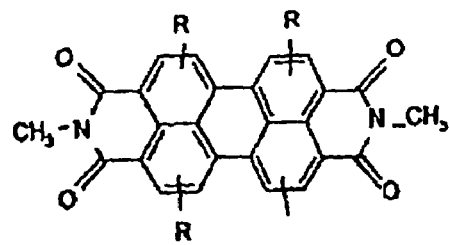
Figure 12B:
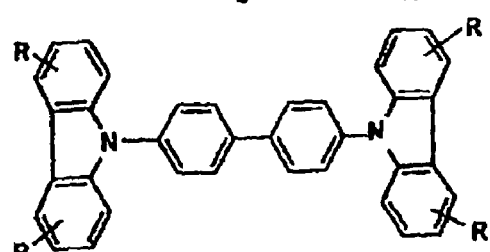
Figure 12C:
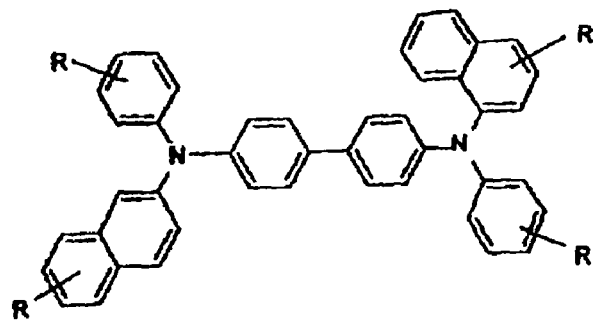
Figure 12D:
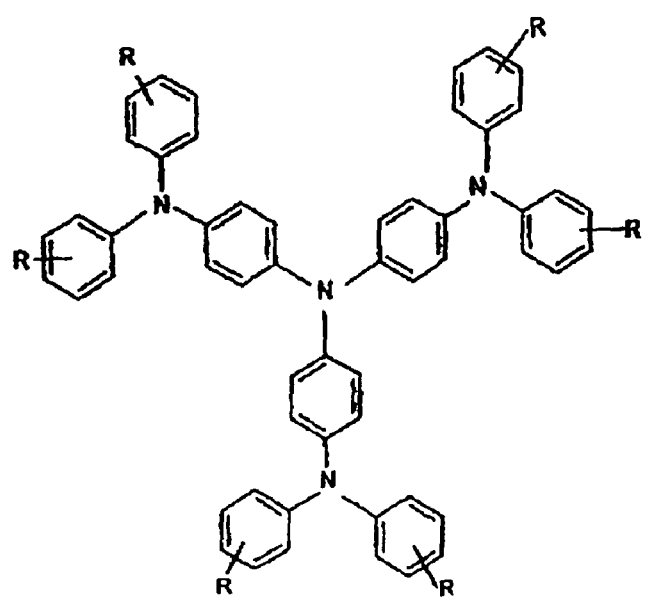
Figure 13A:
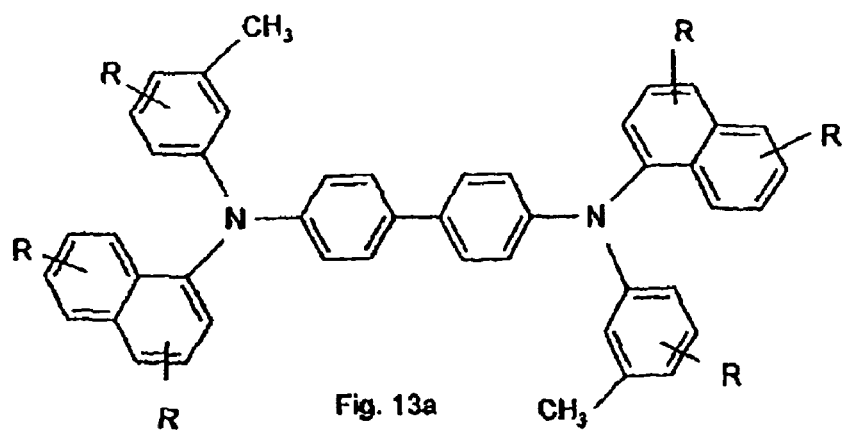
Figure 13B:
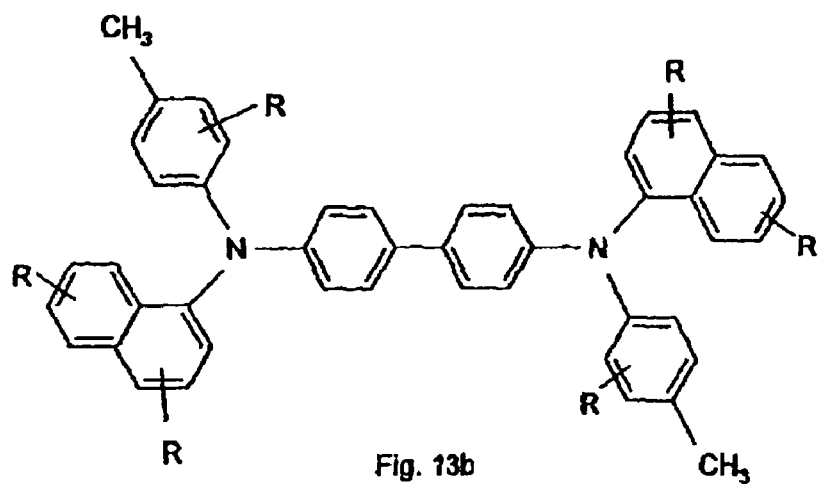
Figure 13C:
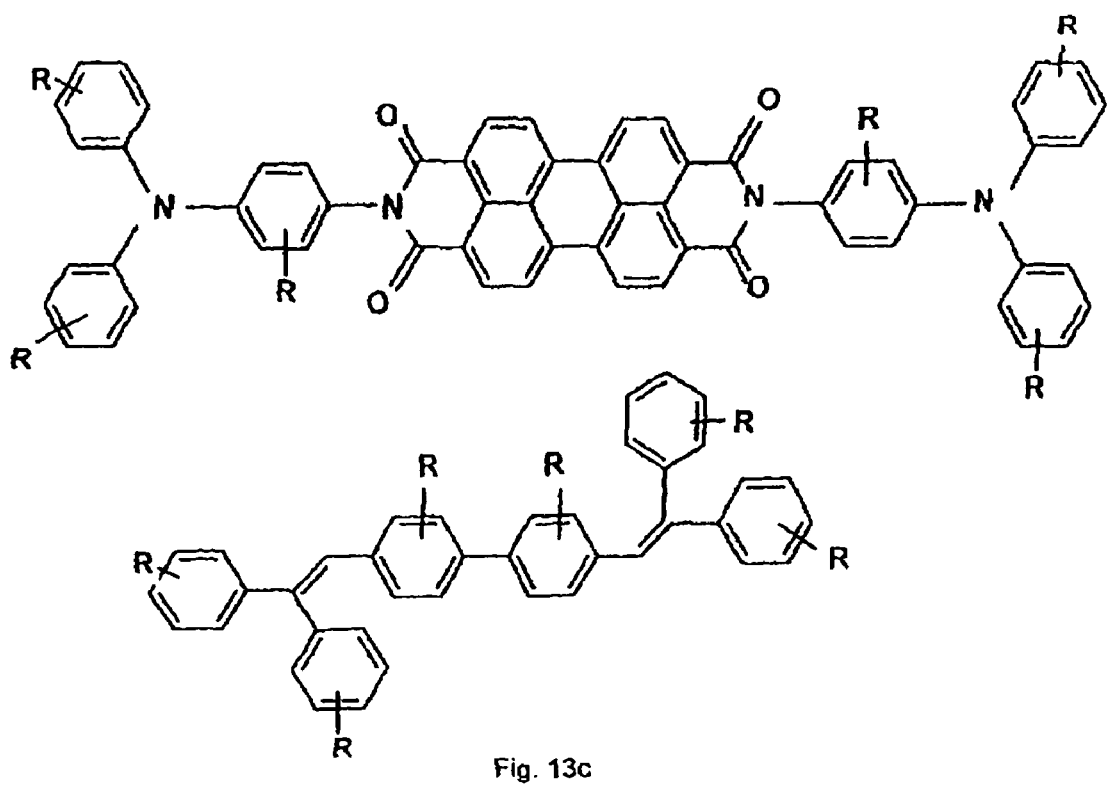
Figure 14A:
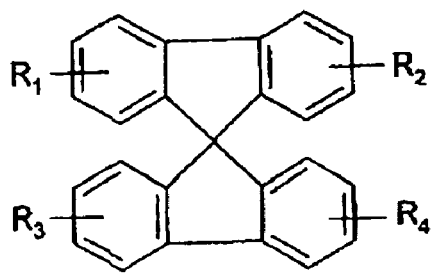
Figure 14B:
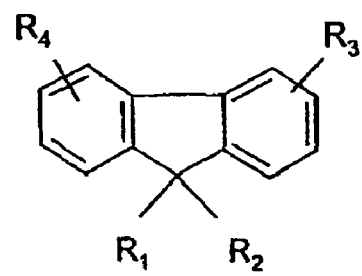
Figure 14C:
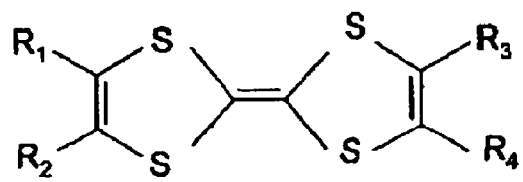
Figure 14C:
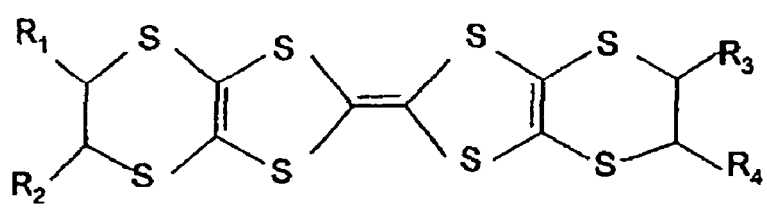
Figure 14D:
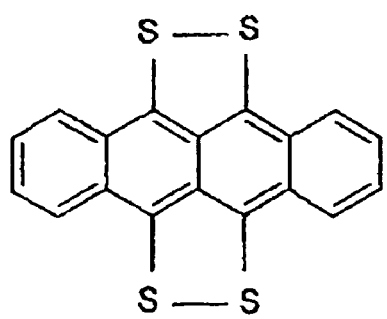
Figure 15A:
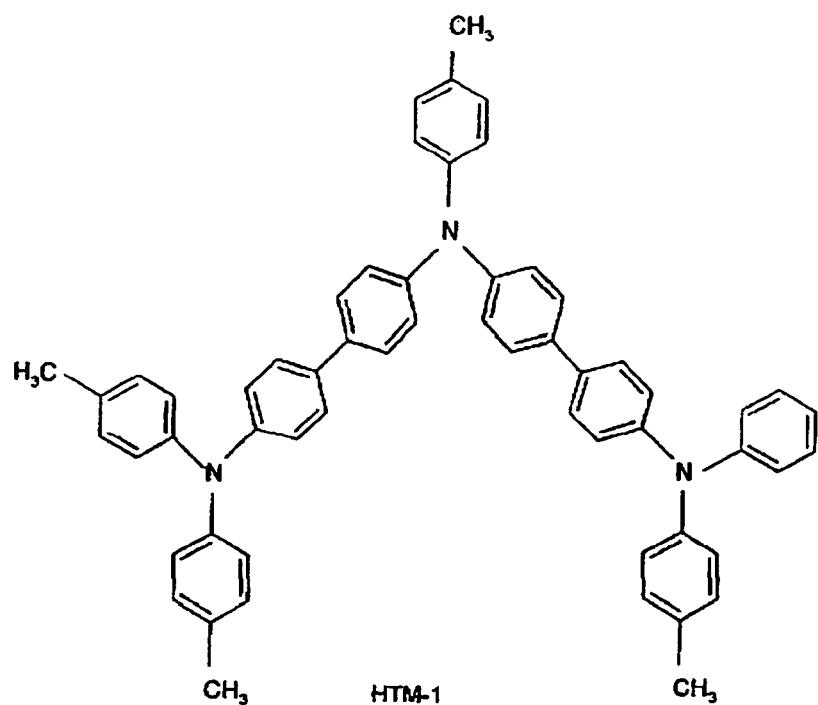
Figure 15B:
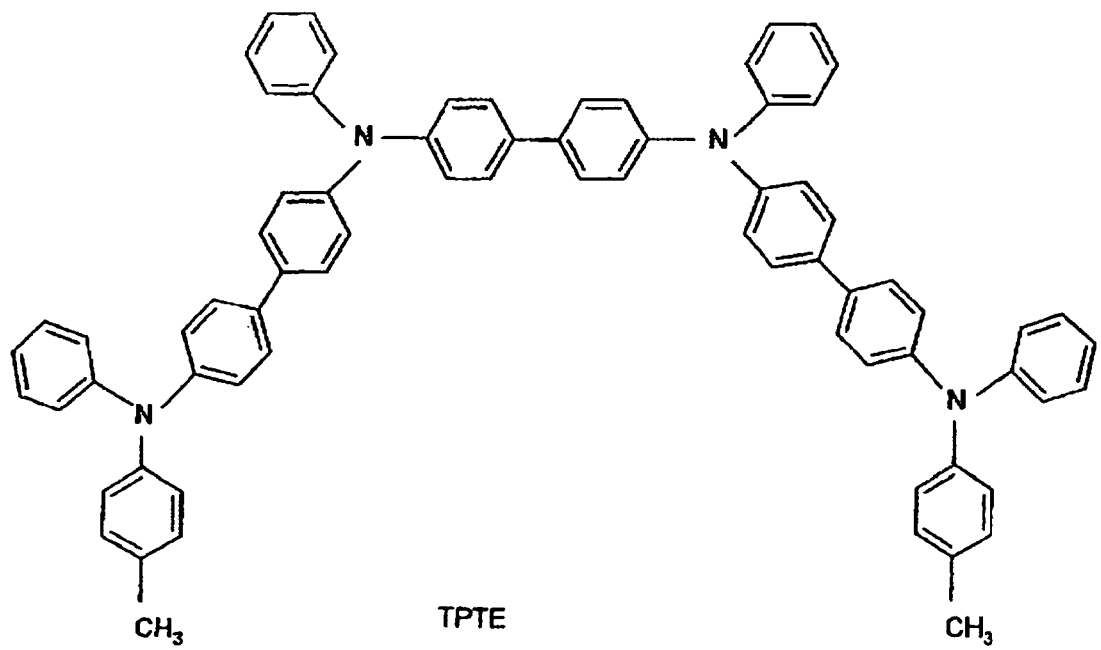
Figure 16A:
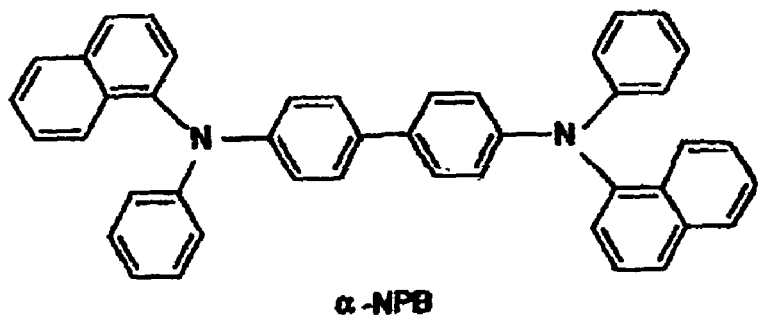
Figure 16B:
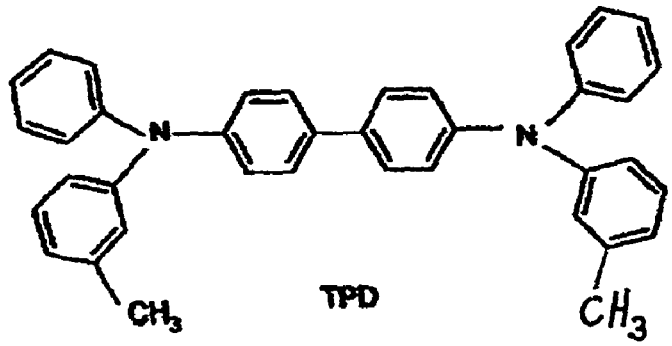
Figure 16C:
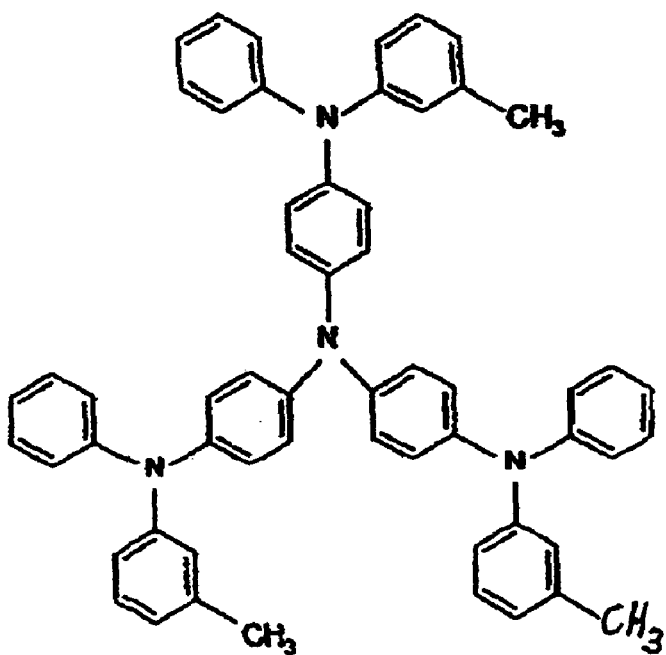

Specific examples of Lα and Lp are tripyridyl and TMHD, and TMHD complexes, α, α', α" tripyridyl, crown ethers, cyclans, cryptans phthalocyanans, porphoryins ethylene diamine tetramine (EDTA), DCTA, DTPA and TTHA, where TMHD is 2,2,6,6-tetramethyl-3,5-heptanedionato and OPNP is diphenylphosphonimide triphenyl phosphorane. The formulae of the polyamines are shown in FIG. 11.

The first electrode can function as the cathode and the second electrode can function as the anode and preferably there is a layer of a hole transporting material between the anode and the layer of the electroluminescent compound.

The hole transporting material can be any of the hole transporting materials used in electroluminescent devices.

The hole transporting material can be an amine complex such as poly (vinylcarbazole), N,N'diphenyl-N,N'-bis (3-methylphenyl)-1,1'-biphenyl 4,4'-diamine (TPD), an unsubstituted or substituted polymer of an amino substituted aromatic compound, a polyaniline, substituted polyanilines, polythiophenes, substituted polythiophenes, polysilanes etc. Examples of polyanilines are polymers of

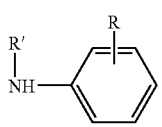

(XXVI)

where R is in the ordio—or meta-position and is hydrogen, C1-18 alkyl, C1-6 alkoxy, amino, chloro, bromo, hydroxy or the group

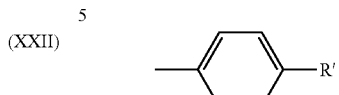

where R is alky or aryl and R' is hydrogen, C1-6 alkyl or aryl with at least one other monomer of formula I above, or the hole transporting material can be a polyaniline; polyanilines which can be used in the present invention have the general formula

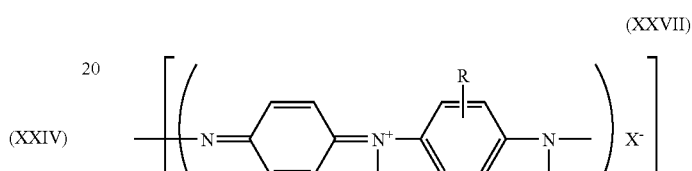

(XXVII)

where p is from 1 to 10 and n is from 1 to 20, R is as defined above and X is an anion, preferably selected from Cl, Br, $SO_4$, $BF_4$, $PF_6$, $H_2PO_3$, $H_2PO_4$, arylsulphonate, arenedicarboxylate, polystrenesulphonate, polyacrylate alkysulphonate, vinylsulphonate, vinylbenzene sulphonate, cellulose sulphonate, camphor sulphonates, cellulose sulphate or a perfluorinated polyanion.

Examples of arylsulphonates are p-toluenesulphonate, benzenesulphonate, 9,10-anthraquinone-sulphonate and anthracenesulphonate. An example of an arenedicarboxylate is phthalate and an example of arenecarboxylate is benzoate.

We have found that protonated polymers of the unsubstituted or substituted polymer of an amino substituted aromatic compound such as a polyaniline are difficult to evaporate or cannot be evaporated, however we have surprisingly found that if the unsubstituted or substituted polymer of an amino substituted aromatic compound is deprotonated then it can be easily evaporated, i.e. the polymer is evaporable.

Preferably evaporable deprotonated polymers of unsubstituted or substituted polymer of an amino substituted aromatic compound are used. The de-protonated unsubstituted or substituted polymer of an amino substituted aromatic compound can be formed by deprotonating the polymer by treatment with an alkali such as ammonium hydroxide or an alkali metal hydroxide such as sodium hydroxide or potassium hydroxide.

The degree of protonation can be controlled by forming a protonated polyaniline and de-protonating. Methods of preparing polyanilines are described in the article by A. G. Mac-Diarmid and A. F. Epstein, Faraday Discussions, *Chem Soc.* 88 P319 1989.

The conductivity of the polyaniline is dependant on the degree of protonation with the maximum conductivity being when the degree of protonation is between 40 and 60%, e.g. about 50%.

Preferably the polymer is substantially fully deprotonated.

A polyaniline can be formed of octamer units i.e. p is four e.g.

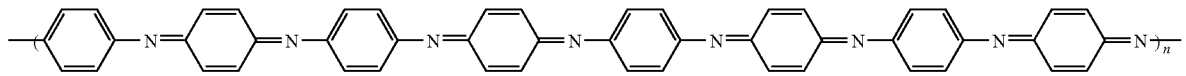

The polyanilines can have conductivities of the order of $1 \times 10^{-1}$ Siemen $cm^{-1}$ or higher.

The aromatic rings can be unsubstituted or substituted, e.g. by a C1 to 20 alkyl group such as ethyl.

The polyaniline can be a copolymer of aniline and preferred copolymers are the copolymers of aniline with o-anisidine, m-sulphanilic acid or o-aminophenol, or o-toluidine with o-aminophenol, o-ethylaniline, o-phenylene diamine or with amino anthracenes.

Other polymers of an amino substituted aromatic compound which can be used include substituted or unsubstituted polyaminonapthalenes, polyaminoanthracenes, polyaminopbenanthrenes, etc. and polymers of any other condensed polyaromatic compound. Polyaminoanthracenes and methods of making them are disclosed in U.S. Pat. No. 6,153,726. The aromatic rings can be unsubstituted or substituted, e.g. by a group R as defined above.

Other hole transporting materials are conjugated polymer and the conjugated polymers which can be used ran be any of the conjugated polymers disclosed or referred to in U.S. Pat. No. 5,807,627, PCT/WO90/13148 and PCT/WO92/03490.

The preferred conjugated polymers are poly (p-phenylenevinylene)-PPV and copolymers including PPV. Other preferred polymers are poly(2,5 dialkoxyphenylene vinylene) such as poly (2-methoxy-5-2-methoxypentyloxy-1,4-phenylene vinylene), poly(2-methoxypentyloxy)-1,4-phenylenevinylene), poly(2-methoxy-5-(2-dodecyloxy-1,4-phenylenevinylene) and other poly(2,5 dialkoxyphenylenevinylenes) with at least one of the alkoxy groups being a long chain solubilising alkoxy group, poly fluorenes and oligofluorenes, polyphenylenes and oligophenylenes, polyanthracenes and oligo anthracenes, ploythiophenes and oligothiophenes.

In PPV the phenylene ring may optionally carry one or more substituents, e.g. each independently selected from alkyl, preferably methyl, alkoxy, preferably methoxy or ethoxy.

Any poly(arylenevinylene) including substituted derivatives thereof can be used and the phenylene ring in poly(p-phenylenevinylene) may be replaced by a fused ring system such as anthracene or naphthlyene ring and the number of vinylene groups in each polyphenylenevinylene moiety can be increased, e.g. up to 7 or higher.

The conjugated polymers can be made by the methods disclosed in U.S. Pat. No. 5,807,627, PCT/WO90/13148 and PCT/WO92/03490.

The thickness of the hole transporting layer is preferably 20 nm to 200 nm.

The polymers of an amino substituted aromatic compound such as polyanilines referred to above can also be used as buffer layers with or in conjunction with other hole transporting materials.

The structural formulae of some other hole transporting materials are shown in FIGS. 12 to 16 of the drawings, where $R_1$, $R_2$ and $R_3$ can be the same or different and are selected from hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine or thiophenyl groups; $R_1$, $R_2$ and $R_3$ can also form substituted and unsubstituted fused aromatic, heterocyclic and polycyclic ring structures and can be copolymerisable with a monomer, e.g. styrene. X is Se, S or O, Y can be hydrogen, substituted or unsubstituted hydrocarbyl groups, such as substituted and unsubstituted aromatic, heterocyclic and polycyclic ring structures, fluorine, fluorocarbons such as trifluoryl methyl groups, halogens such as fluorine or thiophenyl groups or nitrile.

Examples of $R_1$ and/or $R_2$ and/or $R_3$ include aliphatic, aromatic and heterocyclic alkoxy, aryloxy and carboxy groups, substituted and substituted phenyl, fluorophenyl, biphenyl, phenanthrene, anthracene, naphthyl and fluorene groups alkyl groups such as t-butyl, heterocyclic groups such as carbazole.

Figure 9:
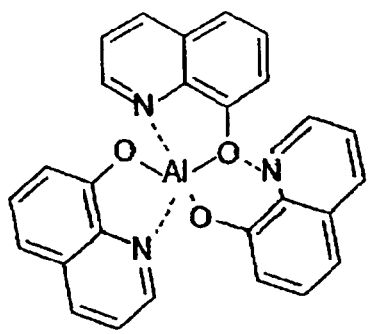
Figure 9:
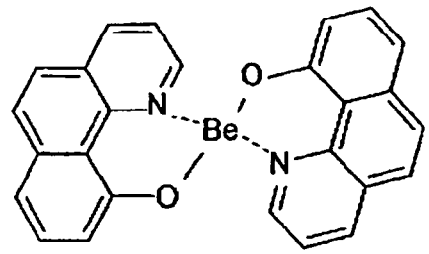
Figure 9:
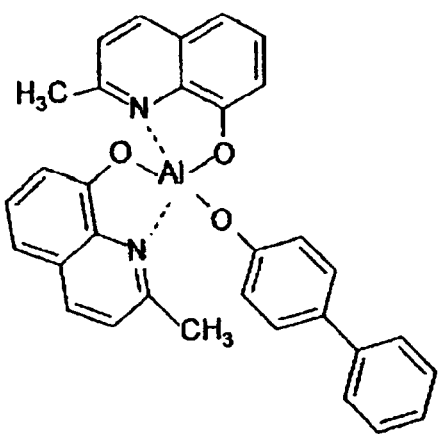
Figure 9:
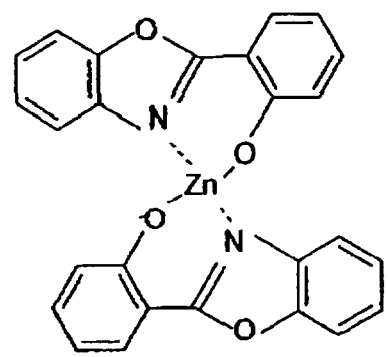
Figure 9:
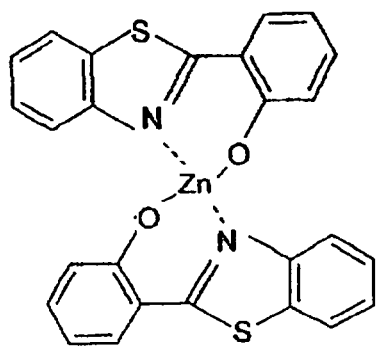
Figure 9:
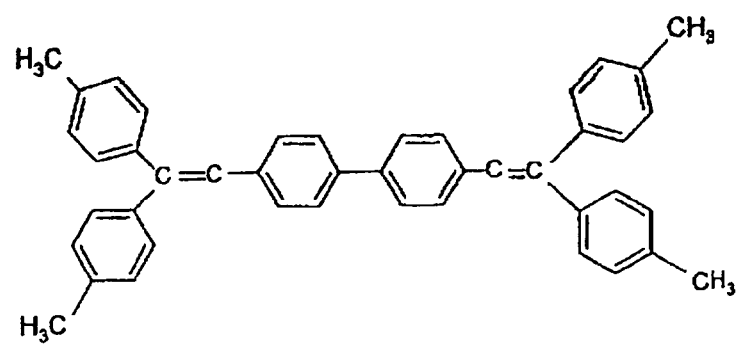
Figure 10:
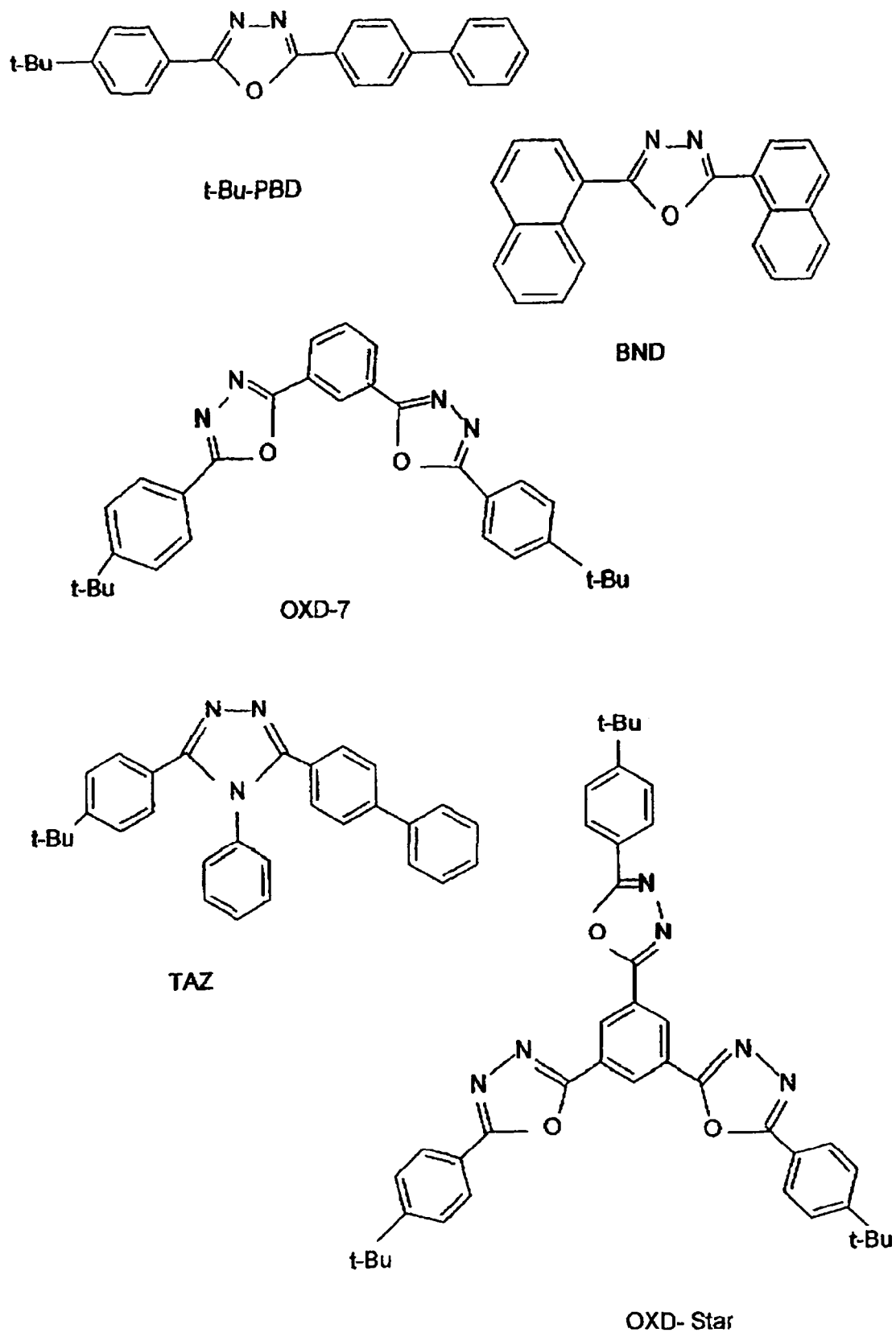

Optionally there is a layer of an electron injecting material between the cathode and the electroluminescent material layer. The electron injecting material is a material which will transport electrons when an electric current is passed through electron injecting materials include a metal complex such as a metal quinolate, e.g. an aluminium quinolate, lithium quinolate, $Mx(DBM)_n$ where Mx is a metal and DBM is dibenzoyl methane and n is the valency of Mx, e.g Mx is aluminium or chromium. The electron injecting material can also be a cyano anthracene such as 9,10 dicyano anthracene, cyano substituted aromatic compounds, tetracyanoquinidodimethane a polystyrene sulphonate or a compound with the structural formulae shown in FIG. 9 or 10 of the drawings in which the phenyl rings can be substituted with substituents R as defined above. Instead of being a separate layer the electron injecting material can be mixed with the electroluminescent material and co-deposited with it.

Optionally the hole transporting material can be mixed with the electroluminescent material and co-deposited with it.

The hole transporting materials, the electroluminescent material and the electron injecting materials can be mixed together to form one layer, which simplifies the construction.

The anode is preferably a transparent substrate such as a conductive glass or plastic material which acts as the anode; preferred substrates are conductive glasses such as indium tin oxide coated glass, but any glass which is conductive or has a conductive layer such as a metal or conductive polymer can be used. Conductive polymers and conductive polymer coated glass or plastics materials can also be used as the substrate.

The cathode is preferably a low work function metal e.g. aluminium, calcium, lithium, magnesium and alloys thereof such as silver/magnesium alloys, rare earth metal alloys etc; aluminium is a preferred metal. A metal fluoride such as an alkali metal, rare earth metal or their alloys can be used as the second electrode, for example by having a metal fluoride layer formed on a metal.

The invention is illustrated in the examples.

EXAMPLE 1

Figure 17A:
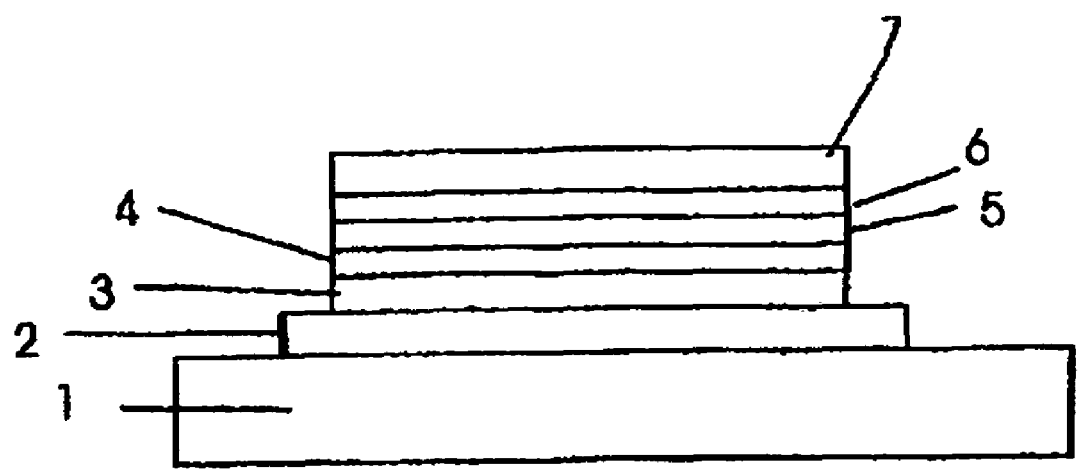
FIGS. 17a and 17b are diagrammatic sections of an OLED showing layer structures in embodiments of the invention.
Figure 17B:
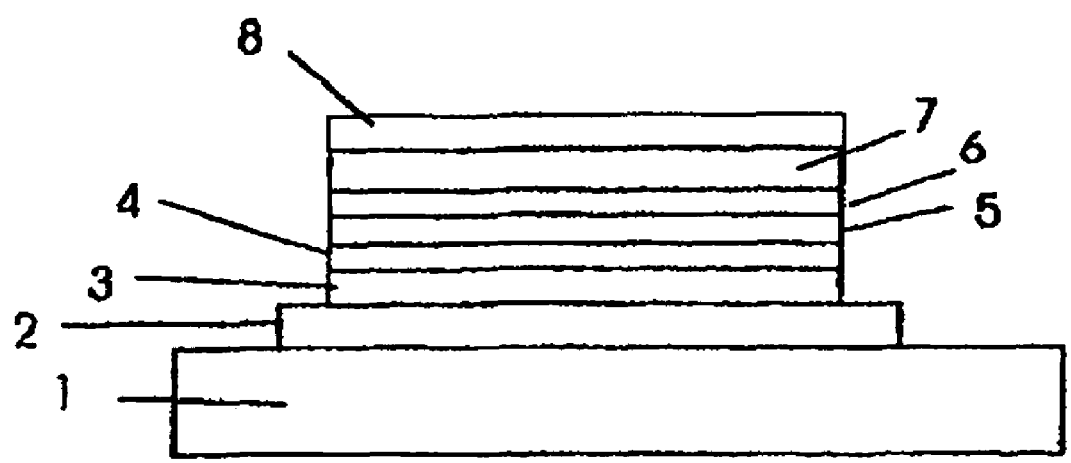
Figure 18:
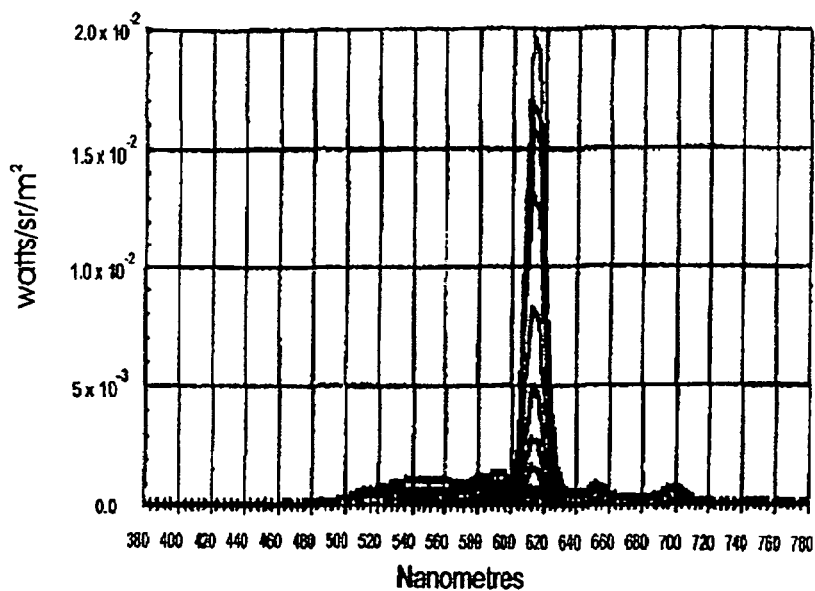
FIGS. 18-20 show the spectrum of the light emitted by devices of the examples at various applied voltages.
Figure 19:
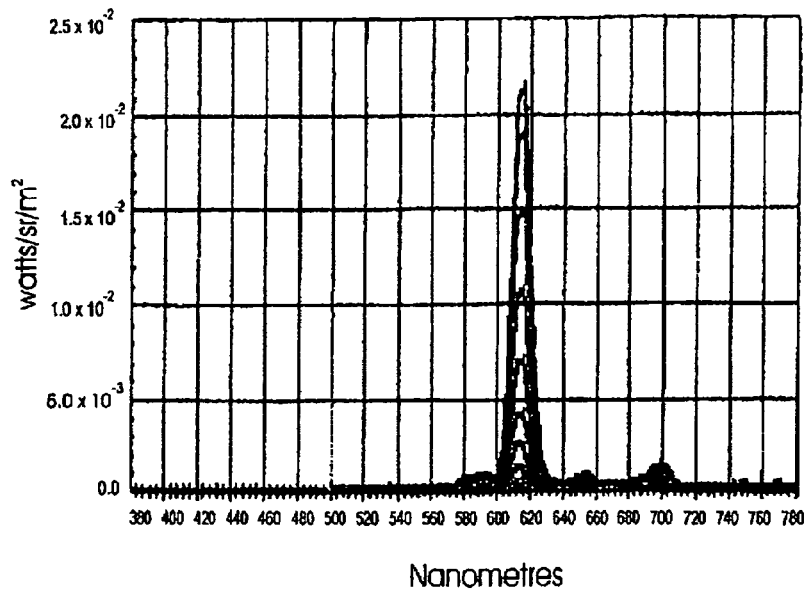
Figure 20:
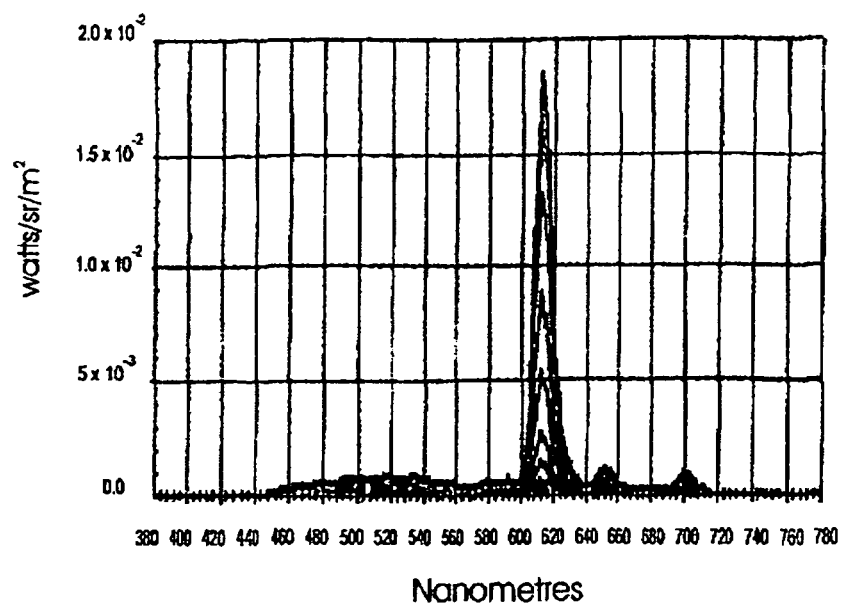
Figure 21:
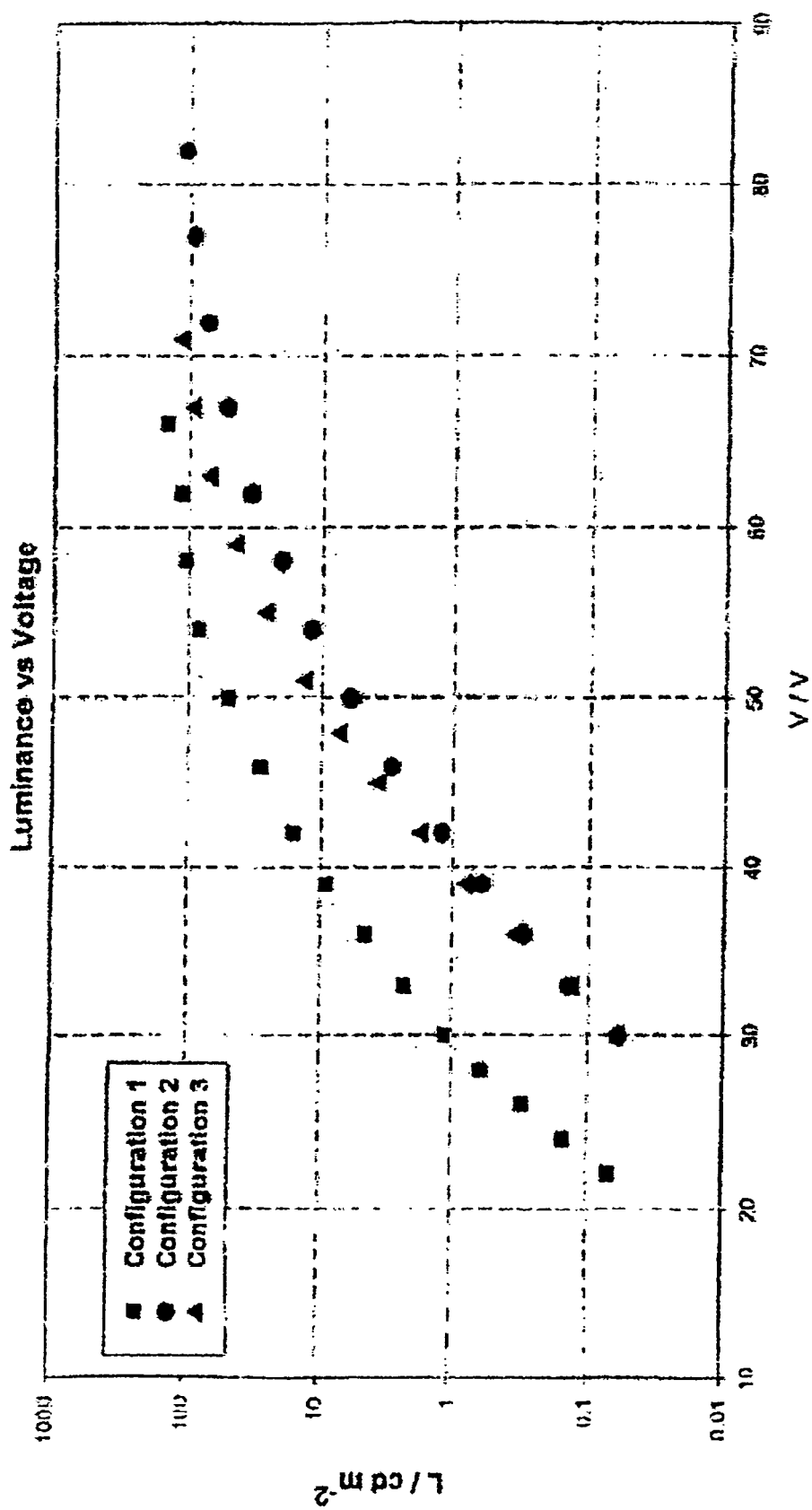
FIGS. 21-25 are performance curves for the exemplified devices.
Figure 22:
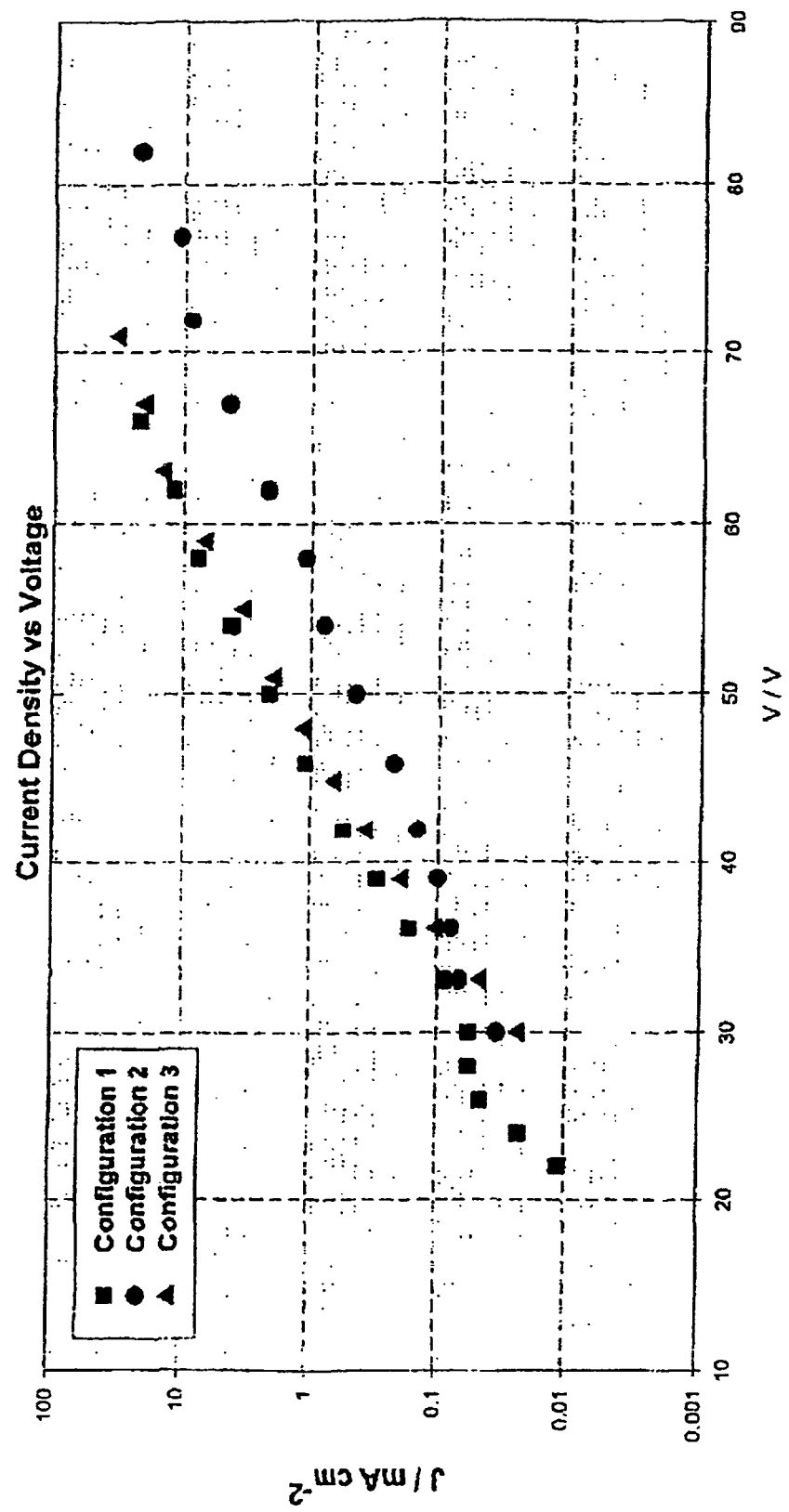
Figure 23:
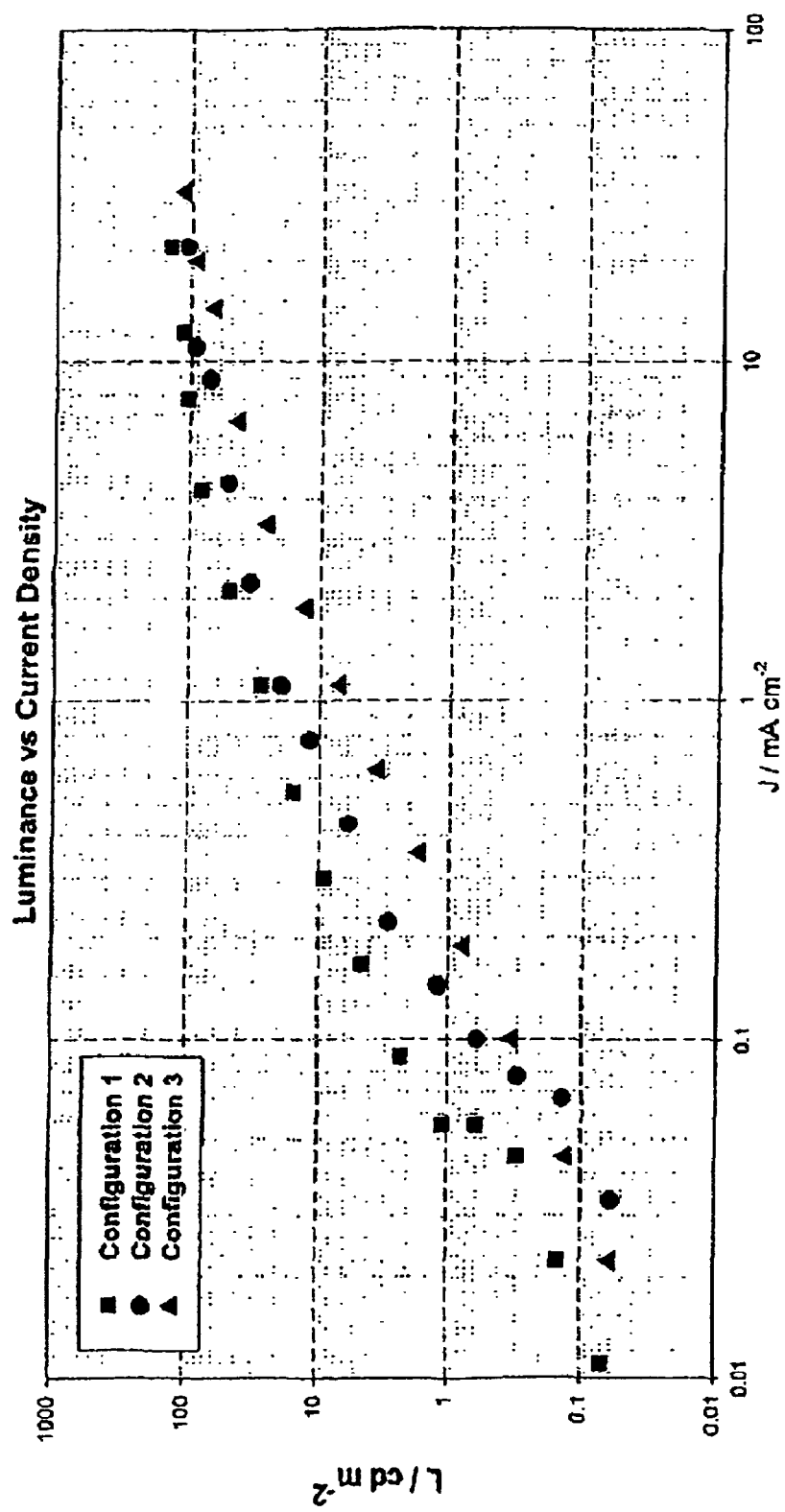
Figure 24:
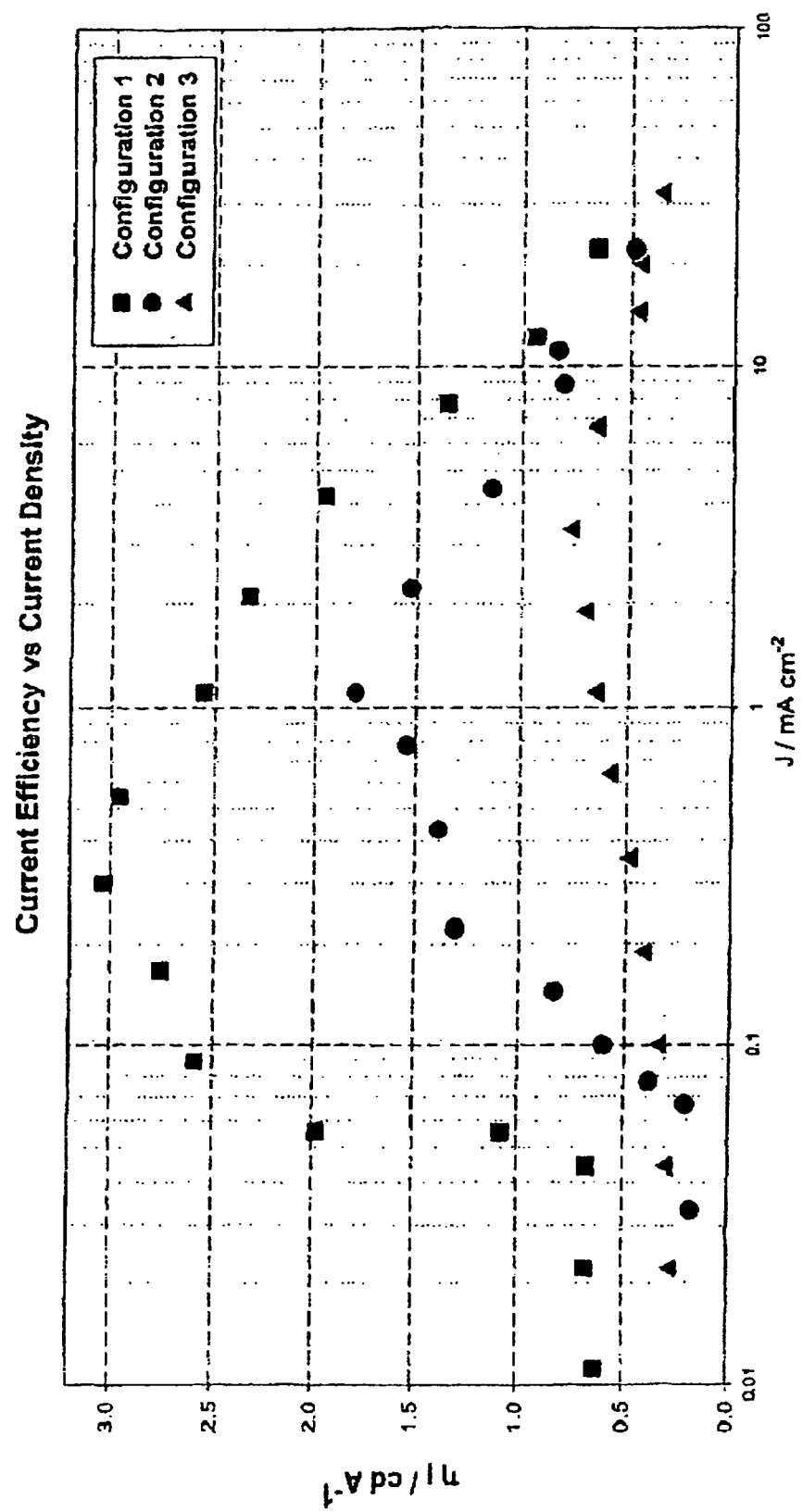
Figure 25:
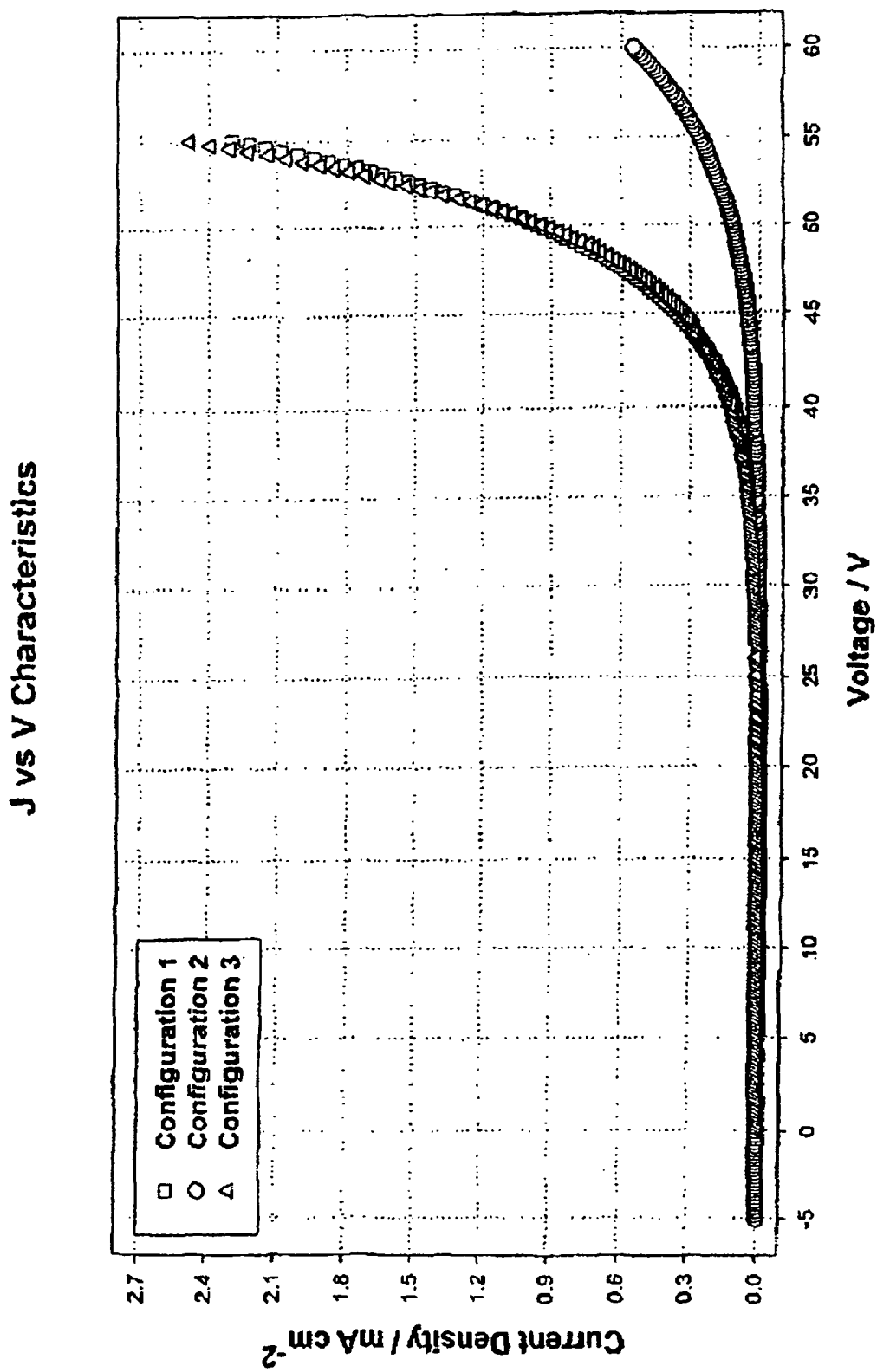

An example of an electroluminescent device according to the invention is shown in FIGS. 17a, 17b, of the drawings. A pre-etched ITO coated glass piece ($10 \times 10$ $cm^2$) was used. The device was fabricated by sequentially forming layers on the ITO, by vacuum evaporation using a Solciet Machine, ULVAC Ltd. Chigacki, Japan; the active area of each pixel was 3 mm by 3 mm.

In FIG. 17a on the ITO coated glass anode (1) there are layers in which (2) is a hole transporting layer of TPD, (3) is a layer of Eu(DBM)$_3$OPNP(R1), (4) is a layer of Gd(tmhd)$_3$Phen, (5) is an electron transmitting layer of aluminium quinolate, (6) is a lithium fluoride layer and (7) is an aluminium cathode.

When an electric current is passed through the device red light is emitted via (1).

Various structures were formed and the colour coordinates x:y and their peak efficiencies measured and the results shown in Table 1. The colour coordinates are as on the CIE 1931 Chart.

TABLE 1

| Reference | Cd/m$^2$ | Cd/A | x | y |
|---|---|---|---|---|
| 1 | 2.4 | 1.13 | 0.66 | 0.33 |
| 2 | 15.4 | 2.01 | 0.66 | 0.33 |
| 3 | 0.9 | 3.13 | 0.66 | 0.33 | where 1 is—
ITO/TPD(35.5 nm)/R1 (23.6 nm)/Gd(tmhd)$_3$Phen(20.3 nm)/R1(24.2 nm)Alq3(15.5 nm/Al 2 is—
ITO/TPD(33 nm)/R1(23 nm)/Gd(tmhd)$_3$Phen(10 nm)R1(10 mm)/Gd(tmhd)$_3$Phen(10 nm)/R1(23 nm)Alq3(9 nm/Al 3 is—
ITO/DFDAA(13 nm)/TPD(33 nm)/R1(23 nm)/Gd(tmhd)$_3$Phen(10 nm)/R1(10 nm)/Gd(tmhd)$_3$Phen(10 nm)/R1(23 nm)Alq3(9 nm)/Al where R1 is Eu(DBM)$_3$OPNP and DFDAA is a buffer layer.

EXAMPLE 2

An electroluminescent device shown in FIG. 17a was formed. As in example 1 there are layers 1 to 7 where (1) is ITO, (2) is CuPc (3) is α-NPB (4) is the electroluminescent mixture (5) is Eu(DBM)$_3$OPNP (6) is Alq$_3$ (7) is Al to form:—
ITO/CuPc(8 nm)/α-NPB(40 nm)/R1(10 nm)/CBP+Ir(dpp)$_3$(6%)+R1(40%)(20 nm)/R1(20 nm)/BCP(6 nm)/Alq3(20 nm)/Al where R1 is Eu(DBM)$_3$OPNP and Ir(dpp)$_3$ is

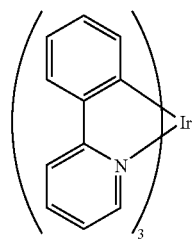

An electric current was passed through the device and the properties of the emitted light measured and the results are shown in the table 2 and in FIGS. 18 and 21 to 25 of the drawings as configuration 1.

EXAMPLE 3

Figure 4A:
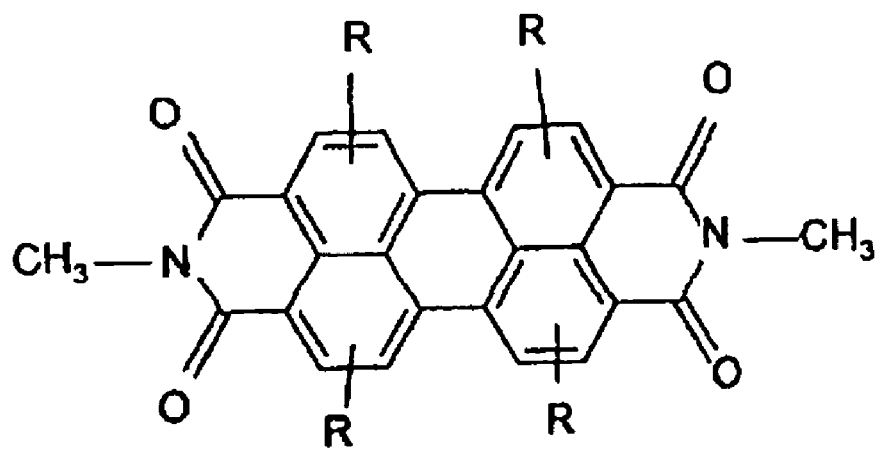
Figure 4B:
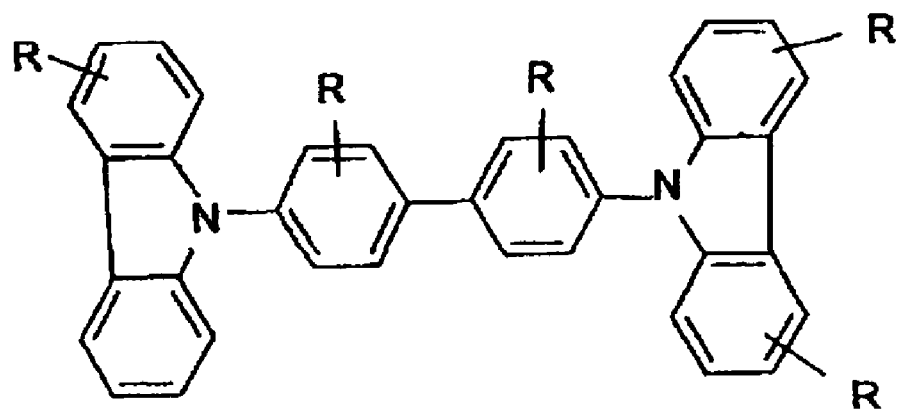
Figure 4C:
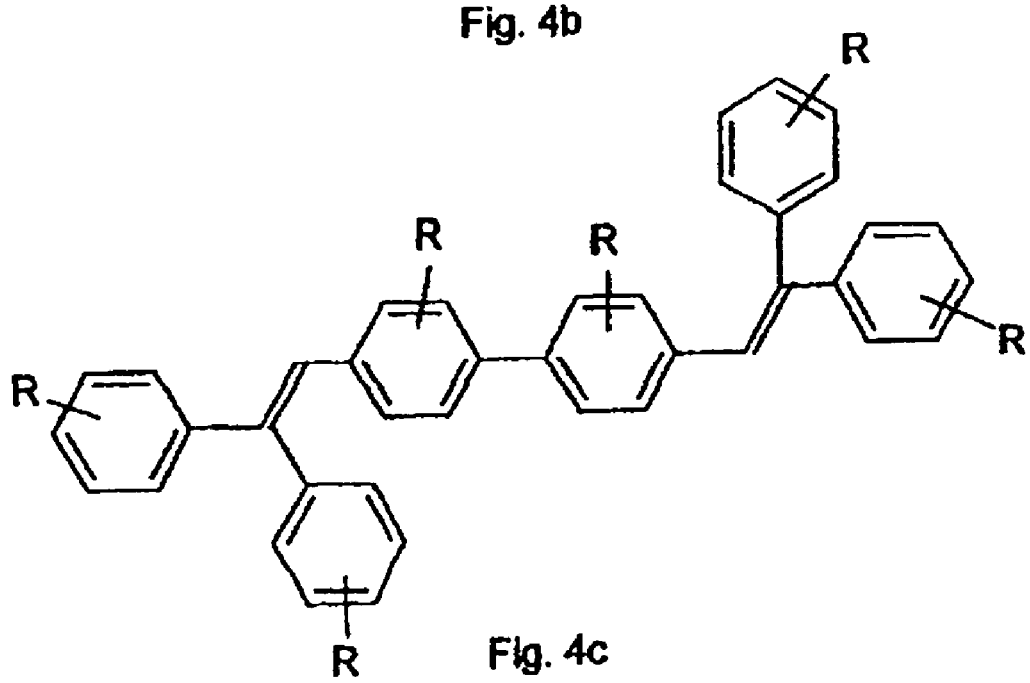
Figure 4I:
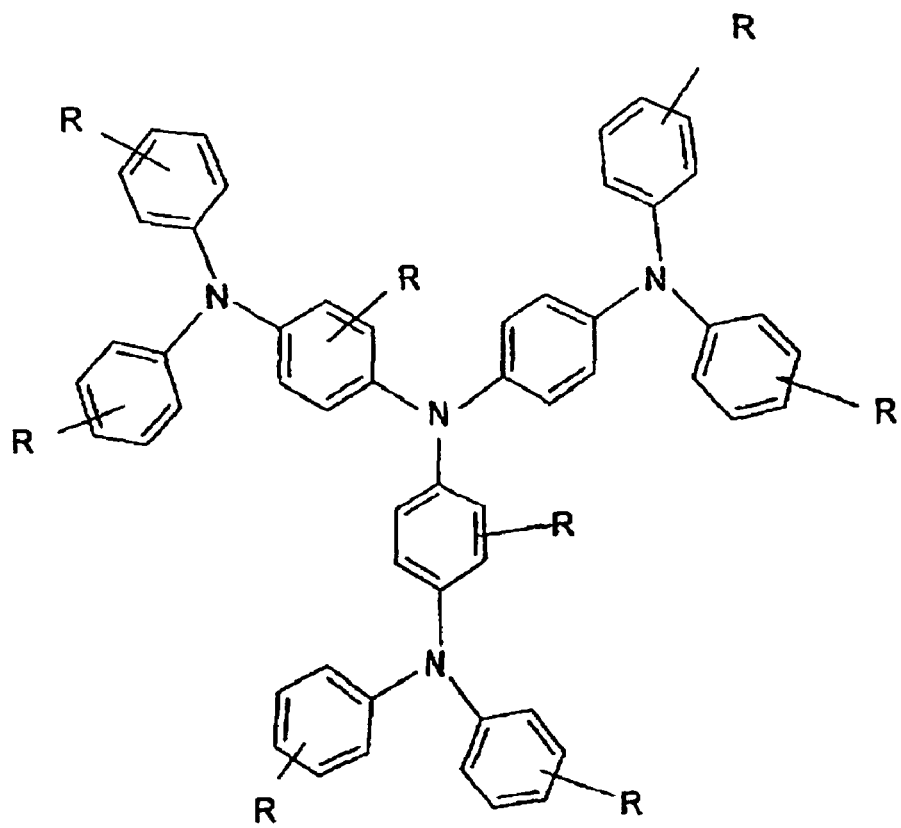
Figure 4J:
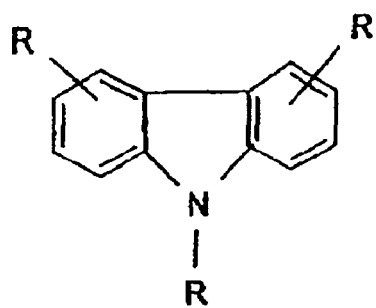
Figure 4K:
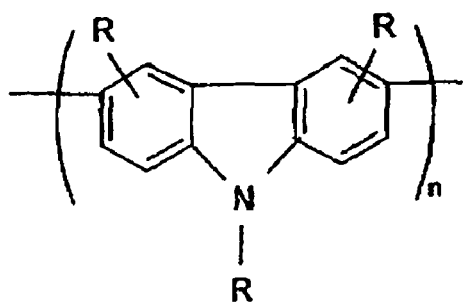
Figure 4L:
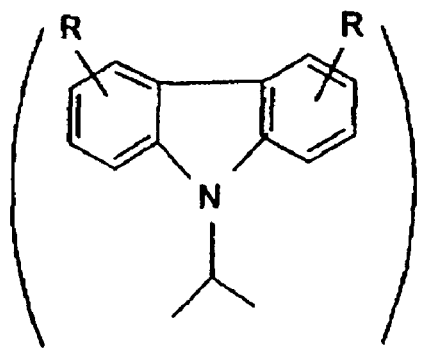
Figure 5A:
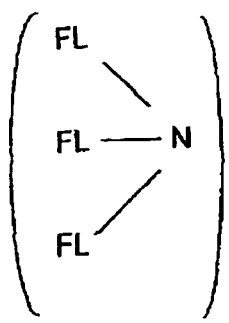
Figure 5B:
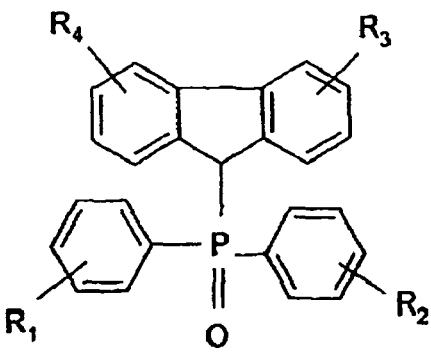
Figure 5C:
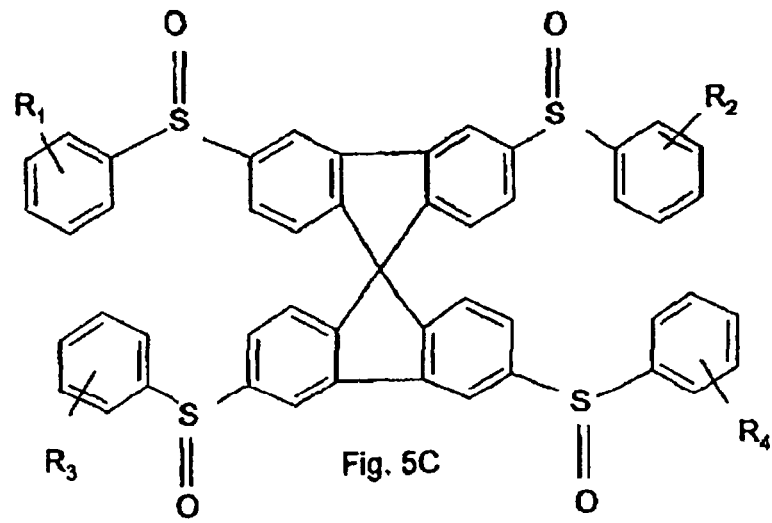
Figure 5D:
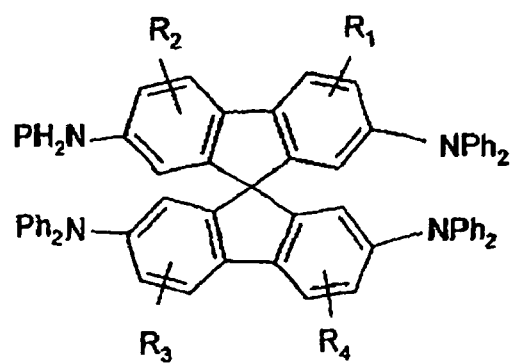
Figure 5F:
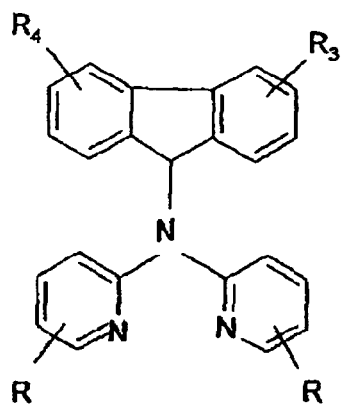
Figure 5G:
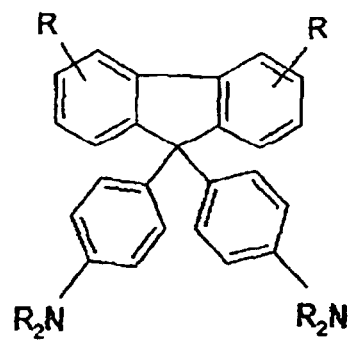
Figure 6A:
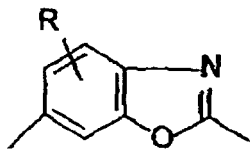
Figure 6B:
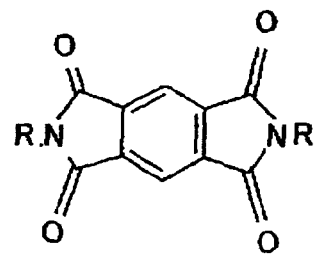
Figure 6C:
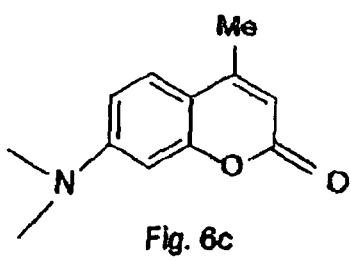
Figure 6D:
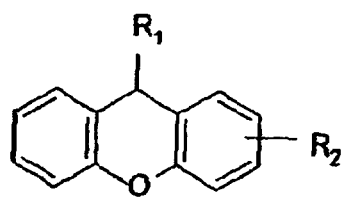
Figure 6E:
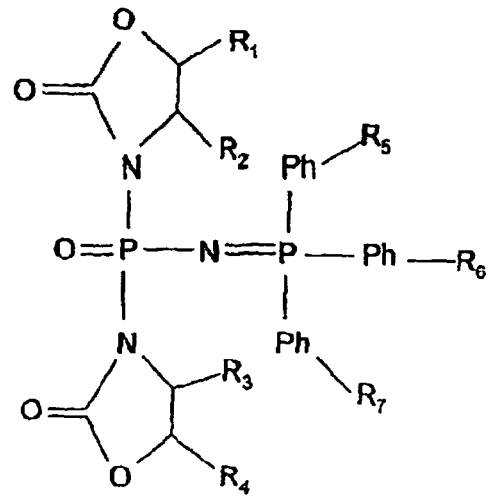
Figure 7A:
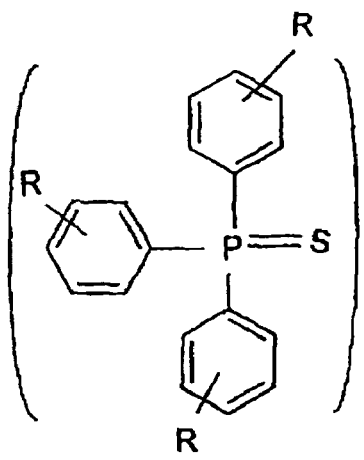
Figure 7B:
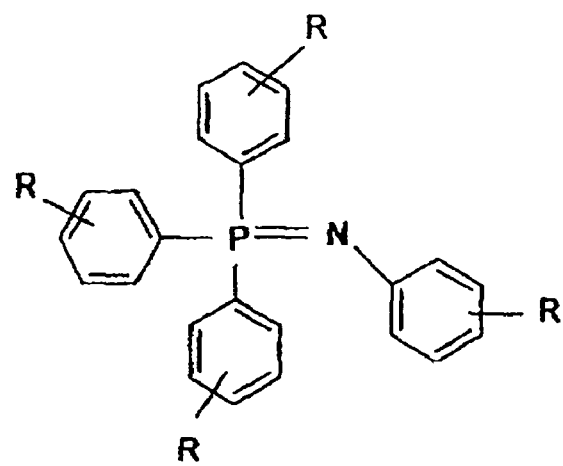
Figure 7C:
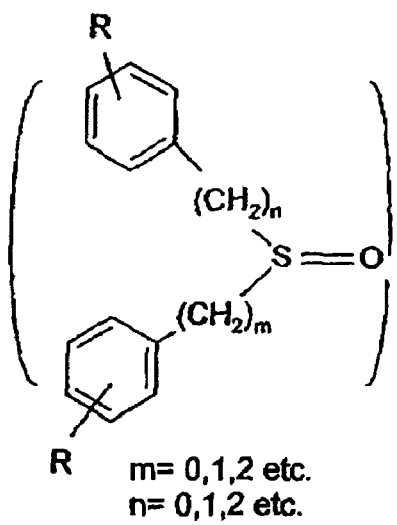
Figure 7D:
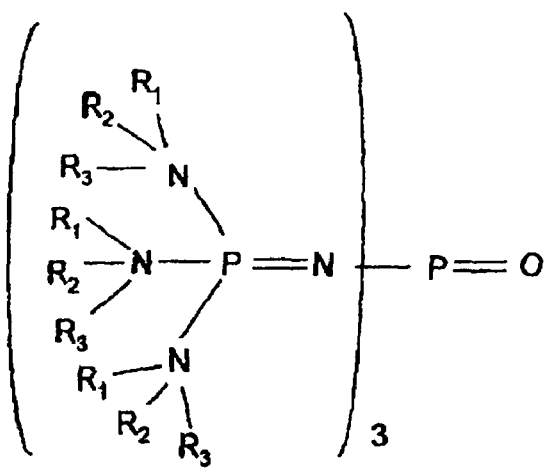
Figure 7E:
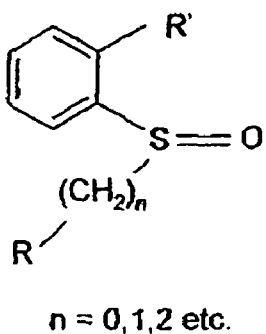
Figure 7F:
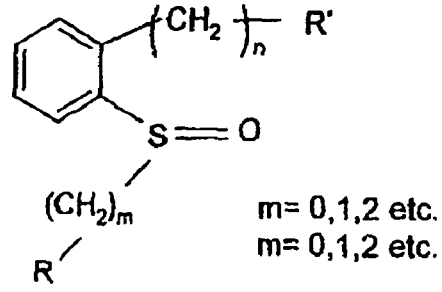
Figure 8A:
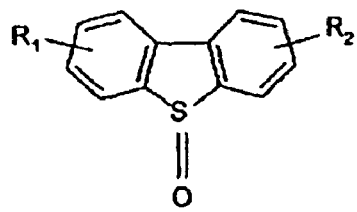
Figure 8B:
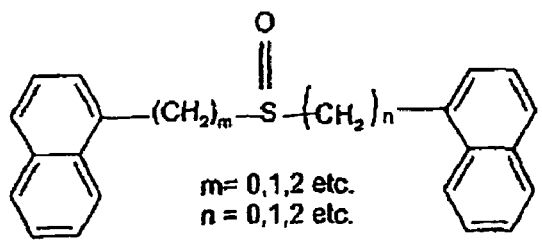
Figure 8C:
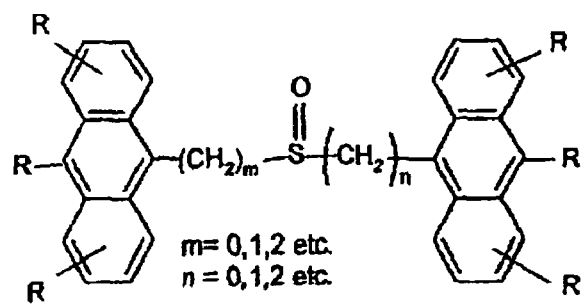
Figure 8D:
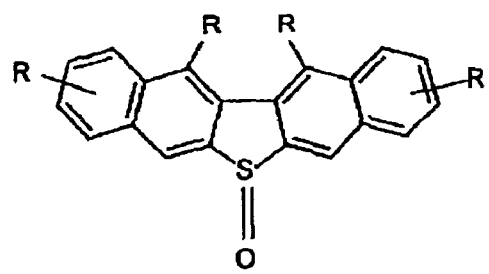
Figure 8E:
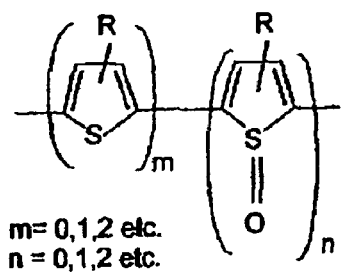
Figure 8F:
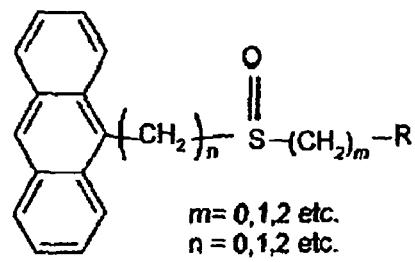
Figure 8G:
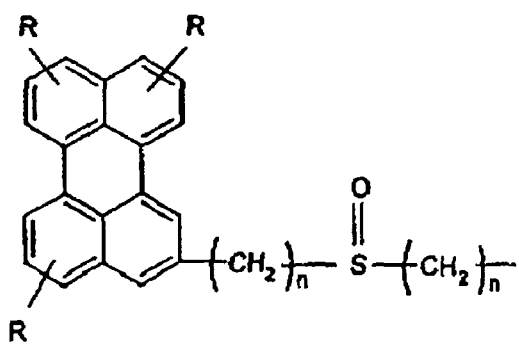
Figure 8H:
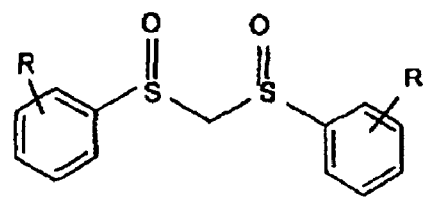

A device was constructed as in example 1 which had the structure as shown in FIG. 17b in which (1) is ITO, (2) is CuPc, (3) is α-NPB, (4) is the electroluminescent mixture, (5) is Eu(DBM)$_3$OPNP, (6) is BCP, (7) is Alq$_3$ (8) is aluminium. The structure was:—
ITO/CuPc(8 nm)/α-NPB(40 nm)/Ir(diacac)$_2$(dpp)$_2$(6%)+CBP+R1(40%)(20 nm)/R1(20 nm)/BCP(6 nm)/Alq3(20 nm)/Al where Ir(diacac)$_3$ is iridium di-acetylacetonate and CBP is shown in FIG. 4b with R being H and is a host compound.

An electric current was passed through the device and the properties of the emitted light measured and the results are shown in Table 2 and in FIGS. 19 and 21 to 25 of the drawings as configuration 2.

EXAMPLE 4

A device was constructed as in example 1 which had the structure of FIG. 17a and consisted of
ITO/CuPc(8 nm)/α-NPB(40 nm)/R1(40%)+Ir(acac)$_3$(6%)+CBP(20 nm)/BCP(6 nm)/Alq3(20 nm)/Al where Ir(acac)$_3$ is iridium acetylacetonate and BCP is bathocupron.

An electric current was passed through the device and the properties of the emitted light measured and the results are shown in Table 2 and in FIGS. 20 to 25 of the drawings as configuration 3.

TABLE 2

| | Best Current Efficiency | | |
|---|---|---|---|
| Ref. | cd A$^{-1}$ | x | y |
| Example 1 | 3.0 | 0.63 | 0.35 |
| Example 2 | 1.8 | 0.66 | 0.33 |
| Example 3 | 0.8 | 0.63 | 0.34 |

The invention claimed is:
1. An electroluminescent device which comprises:
(i) a first electrode which functions as an anode;
(ii) a second electrode which functions as a cathode; and,
(iii) between said first and second electrodes, the following layers (a) to (e) in sequence:
(a) a layer of a hole transport material;
(b) a first layer comprising a first electroluminescent metal complex or a first electroluminescent organometallic complex having a band gap;
(c) a layer comprising a second electroluminescent metal complex or a second electroluminescent organometallic complex having a band gap, wherein the band gap of the second complex is larger than that of the first complex and wherein the highest occupied molecular orbital (HOMO) of the first complex is higher, and the lowest unoccupied molecular orbital (LUMO) of the first complex is lower, than those of the second complex, and wherein the layer of second complex has a thickness of about 10 nm or less;
(d) a second layer comprising the first complex; and,
(e) a layer of an electron transport material; and, further wherein the second electroluminescent metal complex or second electroluminescent organometallic complex emits light in the ultraviolet region of the spectrum.

2. The device of claim 1, wherein the first electrode/anode is an ITO layer.

3. The device of claim 1, wherein the hole transport material comprises N,N'-diphenyl-N,N'-bis-(3-methylphenyl)-1,1'-biphenyl-4,4'-diamine (TPD), HTM-1, TPTE, α-NPB or mTADATA.

4. The device of claim 1, wherein the first electroluminescent metal complex or first electroluminescent organometallic complex emits light in the red, green or yellow regions of the spectrum.

5. The device of claim 1, wherein the first electroluminescent metal complex or first electroluminescent organometallic complex is a complex including Eu, Tb or Dy.

6. The device of claim 1, wherein the first electroluminescent complex or first electroluminescent organometallic complex is Eu(TMHD)$_3$OPNP or Eu(DBM)$_3$OPNP.

7. The device of claim 1, wherein the second electroluminescent metal complex or second electroluminescent organometallic complex is a complex including Gd or Ce.

8. The device of claim 1, wherein the second electroluminescent metal complex or second electroluminescent organometallic complex is Gd(DBM)$_3$Phen wherein Phen designates the neutral ligand phenanthroline.

9. The device of claim 1, wherein said second electrode comprises a material selected from aluminum, calcium, lithium, and silver/magnesium alloys.

10. The device of claim 1, wherein the electron transport layer comprises a metal quinolate.

11. The device of claim 1, wherein the electron transport material layer comprises aluminum quinolate or lithium quinolate.

12. An electroluminescent device which comprises:
(i) a first electrode which functions as an anode;
(ii) a second electrode which functions as a cathode; and,
(iii) between said first and second electrodes, the following layers (a) to (c) in sequence:
(a) a layer of a hole transport material;
(b) a composite electroluminescent layer comprising in sequence alternating sub-layers of a first electroluminescent metal complex or first organometallic complex having a band gap and a second electroluminescent metal complex or second organometallic complex having a band gap, the composite layer including at least two sub-layers of the second complex and at least three sub-layers of the first complex, wherein the band gap of the second complex is larger than that of the first complex and wherein the highest occupied molecular orbital (HOMO) of the first complex is higher, and the lowest unoccupied molecular orbital (LUMO) of the first complex is lower, than those of the second complex, and wherein each layer of the second complex has a thickness of about 10 nm or less; and,
(c) a layer of an electron transport material; and, further wherein the second electroluminescent metal complex or second electroluminescent organometallic complex emits light in the ultraviolet region of the spectrum.

13. The device of claim 12, wherein each of the sub-layers of first or second complex located between the first and the last sub-layers of the first complex has a thickness of about 10 nm.

14. An electroluminescent device which comprises:
b. a first electrode which functions as an anode;
c. a second electrode which functions as a cathode; and,
d. between said first and second electrodes, the following layers (a) to (g) in sequence:
(a) a layer of a hole transport material;
(b) a first layer comprising a first electroluminescent metal complex or a first electroluminescent organometallic complex having a band gap, such first layer having a thickness of about 23 nm;
(c) a layer comprising a second electroluminescent metal complex or a second electroluminescent organometallic complex having a band gap, wherein the band gap of the second complex is larger than that of the first complex, and wherein the highest occupied molecular orbital (HOMO) of the first complex is higher, and the lowest unoccupied molecular orbital (LUMO) of the first complex is lower, than those of the second complex, and wherein this layer has a thickness of about 10 nm;
(d) a second layer comprising the first complex, this layer having a thickness of about 10 nm;
(e) a second layer comprising the second complex, this layer having a thickness of about 10 nm;
(f) a third layer comprising the first complex, this layer having a thickness of about 23 nm, and,
(g) a layer of an electron transport material; and, further wherein the second electroluminescent metal complex or second electroluminescent organometallic complex emits light in the ultraviolet region of the spectrum.

15. The device of claim 14, wherein the first electrode/anode is an ITO layer.

16. The device of claim 14, wherein the hole transport material comprises N,N'-diphenyl-N,N'-bis-(3-methylphenyl)-1,1'-biphenyl-4,4'-diamine (TPD), HTM-1, TPTE, α-NPB or mTADATA.

17. The device of claim 14, wherein the first electroluminescent metal complex or first electroluminescent organometallic complex emits light in the red, green or yellow regions of the spectrum.

18. The device of claim 14, wherein the first electroluminescent metal complex or first electroluminescent organometallic complex is a complex including Eu, Tb or Dy.

19. The device of claim 14, wherein the first electroluminescent complex or first electroluminescent organometallic complex is Eu(TMHD)$_3$OPNP or Eu(DBM)$_3$OPNP.

20. The device of claim 14, wherein the second electroluminescent metal complex or second electroluminescent organometallic complex is a complex including Gd or Ce.

21. The device of claim 14, wherein the second electroluminescent metal complex or second electroluminescent organometallic complex is Gd(DBM)$_3$Phen wherein Phen designates the neutral ligand phenanthroline.

22. The device of claim 14, wherein said second electrode comprises a material selected from aluminum, calcium, lithium, and silver/magnesium alloys.

23. The device of claim 14, wherein the electron transport layer comprises a metal quinolate.

24. The device of claim 14, wherein the electron transport material layer comprises aluminum quinolate or lithium quinolate.

* * * * *